United States Patent
Kuwahara

(10) Patent No.: US 11,251,060 B2
(45) Date of Patent: Feb. 15, 2022

(54) SUBSTRATE TREATING APPARATUS, CARRIER TRANSPORTING METHOD, AND CARRIER BUFFER DEVICE

(71) Applicant: SCREEN Holdings Co., Ltd., Kyoto (JP)

(72) Inventor: Joji Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 102 days.

(21) Appl. No.: 16/721,987

(22) Filed: Dec. 20, 2019

(65) Prior Publication Data

US 2020/0211881 A1  Jul. 2, 2020

(30) Foreign Application Priority Data

Dec. 28, 2018  (JP) .............................. JP2018-248739

(51) Int. Cl.
*H01L 21/677* (2006.01)
*B65G 47/90* (2006.01)

(52) U.S. Cl.
CPC ........ *H01L 21/67775* (2013.01); *B65G 47/90* (2013.01); *H01L 21/6773* (2013.01); *H01L 21/67745* (2013.01); *H01L 21/67766* (2013.01); *H01L 21/67769* (2013.01); *H01L 21/67772* (2013.01)

(58) Field of Classification Search
None
See application file for complete search history.

(56) References Cited

U.S. PATENT DOCUMENTS

| 7,651,307 | B2 | 1/2010 | Bonora et al. ............. 414/217.1 |
| 9,218,994 | B2 | 12/2015 | Zimmerhackl et al. |
| 2009/0081009 | A1* | 3/2009 | Yamamoto ........ H01L 21/67775 414/222.08 |
| 2010/0003111 | A1* | 1/2010 | Yeo ................... H01L 21/67769 414/222.07 |
| 2010/0290873 | A1 | 11/2010 | Bonora et al. ................ 414/267 |
| 2011/0222994 | A1 | 9/2011 | Inagaki et al. ........... 414/222.07 |
| 2013/0078059 | A1 | 3/2013 | Enokida et al. ......... 414/222.13 |
| 2013/0272824 | A1 | 10/2013 | Iida et al. ................ 414/222.01 |

(Continued)

FOREIGN PATENT DOCUMENTS

| JP | 2009-094460 A | 4/2009 |
| JP | 2011-187796 A | 9/2011 |

(Continued)

OTHER PUBLICATIONS

Office Action dated Dec. 30, 2020 for corresponding Taiwan Patent Application No. 108147768.

(Continued)

*Primary Examiner* — Gerald McClain
(74) *Attorney, Agent, or Firm* — Ostrolenk Faber LLP

(57) ABSTRACT

A substrate treating apparatus, a carrier transporting method, and a carrier buffer device. A carrier transport mechanism transports a carrier between platforms of two openers and carrier storage shelves. The carrier storage shelves and the carrier transport mechanism are each mounted on a first treating block. Accordingly, the carrier storage shelves and the carrier transport mechanism are not extended horizontally from the indexer block, achieving a compact footprint of a substrate treating apparatus.

17 Claims, 26 Drawing Sheets

(56) References Cited

U.S. PATENT DOCUMENTS

| | | | |
|---|---|---|---|
| 2014/0271083 A1 | 9/2014 | Caveney | 414/749.5 |
| 2014/0341681 A1* | 11/2014 | Inagaki | H01L 21/67769 |
| | | | 414/222.13 |
| 2015/0340253 A1* | 11/2015 | Oosterlaken | H01L 21/67736 |
| | | | 414/172 |
| 2020/0206788 A1* | 7/2020 | Kuwahara | B08B 3/00 |
| 2020/0211868 A1* | 7/2020 | Kuwahara | H01L 21/67184 |
| 2020/0211880 A1* | 7/2020 | Kuwahara | H01L 21/67225 |
| 2020/0211882 A1* | 7/2020 | Kuwahara | B65G 1/0457 |

FOREIGN PATENT DOCUMENTS

| | | | | |
|---|---|---|---|---|
| KR | 10-2009-0092799 A | | 9/2009 | |
| KR | 20090092799 A | * | 9/2009 | ....... H01L 21/67772 |
| KR | 10-2013-0032272 A | | 4/2013 | |
| KR | 10-2013-0118236 A | | 10/2013 | |
| KR | 10-1736351 B1 | | 5/2017 | |
| KR | 101736351 B1 | * | 5/2017 | |
| TW | 201116469 A1 | | 5/2011 | |
| TW | 201335050 A1 | | 9/2013 | |
| TW | 201637113 A | | 10/2016 | |

OTHER PUBLICATIONS

Office Action dated Apr. 22, 2021 for corresponding Korean Patent Application No. 10-2019-0175137.
Notice of Allowance dated Aug. 2, 2021 for corresponding Korean Patent Application No. 10-2019-0175137.

* cited by examiner

SUBSTRATE TREATING APPARATUS, CARRIER TRANSPORTING METHOD, AND CARRIER BUFFER DEVICE

CROSS-REFERENCE TO RELATED APPLICATIONS

This application claims priority to Japanese Patent Application No. 2018-248739 filed Dec. 28, 2018, the subject matter of which is incorporated herein by reference in entirety.

BACKGROUND OF THE INVENTION

Field of the Invention

The present invention relates to a substrate treating apparatus for performing treatment on substrates, a carrier transporting method, and a carrier buffer device. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes a substrate treating apparatus body and a carrier buffer device (stocker device) (e.g., Japanese Unexamined Patent Application Publication No. 2011-187796A). The substrate treating apparatus body includes an indexer block and a treating block. The treating block is connected to the indexer block horizontally. The indexer block has a substrate transporting robot built in. A carrier platform is provided on an outer wall of the indexer block. On the carrier platform, a carrier capable of accommodating a plurality of substrates thereon is placed. The carrier platform is disposed opposite to the treating block across the substrate transporting robot.

The carrier buffer device includes a plurality of carrier storage shelves for each storing a carrier, and a carrier transport mechanism. The carrier transport mechanism is configured to transport a carrier between the carrier storage shelves and the carrier platform.

SUMMARY OF THE INVENTION

The currently-used carrier buffer device is disposed opposite to the treating block across the indexer block. In other words, the carrier buffer device is disposed so as to extend horizontally from the indexer block toward the carrier platform. Such a currently-used carrier buffer device may increase a footprint as an installation area of the substrate treating apparatus.

The present invention has been made regarding the state of the art noted above, and one object is to provide a substrate treating apparatus, a carrier transporting method, and a carrier buffer device that allow reduced footprint of the substrate treating apparatus.

Solution to Problem

To achieve the object, the present invention provides a configuration as follows. One aspect of the present invention provides a substrate treating apparatus for performing treatment on a substrate. The substrate treating apparatus includes: a first indexer block on which at least one first carrier platform for placing a carrier capable of accommodating a plurality of substrates thereon is disposed; a first treating block connected to the first indexer block horizontally; a plurality of carrier storage shelves mounted on at least either the first indexer block or the first treating block, and configured to store the carrier; and a carrier transport mechanism mounted on at least either the first indexer block or the first treating block, and configured to transport the carrier between at least the one first carrier platform and the plurality of carrier storage shelves.

With the substrate treating apparatus according to the aspect of the present invention, the carrier transport mechanism transports the carrier between the at least one first carrier platform and the carrier storage shelves. The carrier storage shelves and the carrier transport mechanism are each mounted on at least either the first indexer block or the first treating block. Accordingly, there is no need to provide the carrier storage shelves and the carrier transport mechanism horizontally in an extended manner from the indexer block, achieving reduction in installation area extending horizontally. In other words, reduction in footprint of the substrate treating apparatus is obtainable.

It is preferred that, in the substrate treating apparatus described above, the first treating block is formed by a plurality of treating blocks arranged in line, the first indexer block is connected horizontally to a first treating block of the treating blocks on a first end, the plurality of carrier storage shelves is mounted on at least either the first indexer block or the treating blocks, and is configured to store the carrier, and the carrier transport mechanism is mounted on at least either the first indexer block or the treating blocks, and is configured to transport a carrier between the at least one first carrier platform and the plurality of carrier storage shelves.

This achieves reduction in footprint of the substrate treating apparatus provided with the treating blocks arranged in line.

It is preferred that the substrate treating apparatus described above further includes a second indexer block connected horizontally to a treating block of the treating blocks on a second end, and on which at least one second carrier platform for placing the carrier therein is disposed; the plurality of carrier storage shelves is mounted on at least any of the first indexer block, the treating blocks, and the second indexer block, and is configured to store the carrier, and the carrier transport mechanism is mounted on at least any of the first indexer block, the treating blocks, and the second indexer block, and is configured to transport the carrier among the at least one first carrier platform, the plurality of carrier storage shelves, and the at least one second carrier platform.

This achieves reduction in footprint of the substrate treating apparatus provided with the treating blocks arranged between the two indexer blocks.

It is preferred that the substrate treating apparatus described above further includes a second indexer block disposed between a treating block on a first end side and a treating block on a second end side of the treating blocks, and on which at least one second carrier platform for placing the carrier therein is disposed, the plurality of carrier storage shelves is mounted on at least any of the first indexer block, the treating blocks, and the second indexer block, and is configured to store the carrier, and the carrier transport mechanism is mounted on at least any of the first indexer block, the treating blocks, and the second indexer block, and is configured to transport the carrier among the at least one first carrier platform, the plurality of carrier storage shelves, and the at least one second carrier platform.

This achieves reduction in footprint of the substrate treating apparatus in which the second indexer block is disposed between the two treating blocks.

It is preferred that the substrate treating apparatus described above further includes a second carrier transport mechanism mounted on the treating block on the second end side, opposite to a first carrier transport mechanism as the carrier transport mechanism, across the second indexer block and configured to transport the carrier. The two carrier transport mechanisms each transport the carrier, and thus, efficiency in transporting carriers can be increased. As a result, a throughput of the substrate treating apparatus can be enhanced.

It is preferred that the substrate treating apparatus described above further includes a relay carrier platform disposed on the second indexer block, the first carrier transport mechanism transports the carrier to the second carrier transport mechanism with use of the relay carrier platform, and the second carrier transport mechanism transports the carrier to the first carrier transport mechanism with use of the relay carrier platform. that Accordingly, an area above the second indexer block is usable as a relay platform for the two carrier transport mechanisms. This achieves smooth carrier delivery.

It is preferred that the carrier transport mechanism of the substrate treating apparatus described above further includes a gripper configured to grip a carrier, an arm to which the gripper is attached, a drive unit configured to support the arm, and a guide rail mounted on at least two of the treating blocks and the second indexer block, the drive unit is configured to allow the gripper and the arm to be movable along the guide rail, and the guide rail is mounted on a groove formed in the second indexer block. The guide rail is mounted on the groove formed in the second indexer block. This achieves a lowered level of the carrier transport mechanism. This also achieves usage of an area opposite to the carrier transport mechanism across the second indexer block as the carrier storage shelves.

It is preferred that the carrier transport mechanism of the substrate treating apparatus described above includes a gripper configured to grip a carrier, an arm to which the gripper is attached, a drive unit configured to support the arm, and a guide rail mounted on at least two of the treating blocks, and the drive unit is configured to allow the gripper and the arm to be movable along the guide rail. This achieves an enlarged carrier transportation area by the carrier transport mechanism. This also allows many regions to be used as the carrier storage shelves.

It is preferred that the substrate treating apparatus described above further includes a second indexer block connected opposite to the first indexer block with respect to the first treating block, and on which at least one second carrier platform for placing the carrier therein is disposed; the plurality of carrier storage shelves is mounted on at least any of the first indexer block, the first treating block, and the second indexer block, and is configured to store the carrier, and the carrier transport mechanism is mounted on at least any of the first indexer block, the first treating block, and the second indexer block, and is configured to transport the carrier among the at least one first carrier platform, the plurality of carrier storage shelves, and the at least one second carrier platform.

This achieves reduction in footprint of the substrate treating apparatus in which a single treating block is sandwiched by the two indexer blocks.

It is preferred in the substrate treating apparatus described above that the at least one first carrier platform is disposed higher in level than a top face of the first treating block. The carrier transport mechanism mounted on at least either the first indexer block or the first treating block achieves easy transportation of the carrier placed on the first carrier platform.

It is preferred in the substrate treating apparatus described above that the at least one first carrier platform is disposed above the first treating block. Accordingly, the first carrier platform is capable of being directed toward the carrier transport mechanism. This makes it easy for the carrier transport mechanism to transport the carrier placed on the first carrier platform. Moreover, protrusion of the first carrier platform from the first indexer block is suppressible in plan view, leading to more reduction in footprint of the substrate treating apparatus.

Moreover, it is preferred in the substrate treating apparatus described above that the at least one first carrier platform is disposed in such a manner so as to be housed in an area of at least either the first indexer block or the first treating block in plan view. Accordingly, the first carrier platform is capable of being directed toward the carrier transport mechanism relatively easily. This makes it easy for the carrier transport mechanism to transport the carrier placed on the first carrier platform.

Moreover, it is preferred in the substrate treating apparatus described above that the at least one second carrier platform is disposed higher in level than a top face of the first treating block. The carrier transport mechanism mounted on at least either the first indexer block or the first treating block achieves easy transportation of the carrier placed on the second carrier platform.

Moreover, it is preferred in the substrate treating apparatus described above that the second indexer block includes a substrate transport mechanism configured to transport a substrate, the at least one second carrier platform is two or more second carrier platforms, and the second carrier platforms surround the substrate transport mechanism in plan view. This makes it possible for one substrate transport mechanism to transport the carriers to the two or more second carrier platforms.

Moreover, it is preferred that the substrate treating apparatus described above further includes a lifting/lowering mechanism disposed in the first indexer block, and configured to move the at least one first carrier platform upwardly/downwardly between a top face side and a floor side of the first indexer block. The lifting/lowering mechanism causes the first carrier platform to move upwardly/downwardly, whereby the first carrier platform is movable downwardly to a level where an operator is able to place the carrier directly on the first carrier platform. For instance, when the substrate treating apparatus is used in nonproductive time such as evaluation or maintenance, not an external transport mechanism but an operator often performs hand transportation. In such a case, the operator is able to place the carrier on the first carrier platform directly. Thus, the substrate treating apparatus is usable flexibly in the evaluation or the maintenance, leading to an enhanced work efficiency.

Moreover, it is preferred that the substrate treating apparatus described above further includes an opening through which the substrate passes from the carrier placed on the first carrier platform, a shutter member configured to open and close the opening, and a shutter member drive mechanism configured to move the shutter member horizontally along the opening. Accordingly, a space is obtainable in a lower region of the opening in which the substrate platform is placed, for example.

Another aspect of the present invention provides a carrier transporting method for a substrate treating apparatus. The substrate treating apparatus includes: a first indexer block on which at least one first carrier platform for placing a carrier capable of accommodating substrates thereon is disposed, and a first treating block connected to the first indexer block horizontally, and the method includes: a storing step of storing the carrier in each of a plurality of carrier storage shelves mounted on at least either the first indexer block or the first treating block, and a transporting step of transporting the carrier between at least the one first carrier platform and the plurality of carrier storage shelves with a carrier transport mechanism mounted on at least either the first indexer block or the first treating block.

With the carrier transporting method according to the aspect of the present invention, the carrier transport mechanism transports the carrier between at least one first carrier platform and the carrier storage shelves. The carrier storage shelves and the carrier transport mechanism are each mounted on at least either the first indexer block or the first treating block. Accordingly, there is no need to provide the carrier storage shelves and the carrier transport mechanism horizontally in an extended manner from the indexer block, achieving reduction in installation area extending horizontally. In other words, reduction in footprint of the substrate treating apparatus is obtainable.

Another aspect of the present invention discloses a carrier buffer device disposed in a substrate treating apparatus body including a first indexer block on which at least one first carrier platform for placing a carrier capable of accommodating substrates thereon is disposed, and a first treating block connected to the first indexer block horizontally, the carrier buffer device including: a plurality of carrier storage shelves mounted on at least either the first indexer block or the first treating block, and configured to store the carrier; and a carrier transport mechanism mounted on at least either the first indexer block or the first treating block, and configured to transport the carrier between at least the one first carrier platform and the plurality of carrier storage shelves.

With the carrier buffer device according to the aspect of the present invention, the carrier transport mechanism transports the carrier between at least one first carrier platform and the carrier storage shelves. The carrier storage shelves and the carrier transport mechanism are each mounted on at least either the first indexer block or the first treating block. Accordingly, there is no need to provide the carrier storage shelves and the carrier transport mechanism horizontally in an extended manner from the indexer block, achieving reduction in installation area extending horizontally. In other words, reduction in footprint of the substrate treating apparatus is obtainable.

Advantageous Effects of Invention

The substrate treating apparatus, the carrier transporting method, and the carrier buffer device according to the present invention allow reduced footprint of the substrate treating apparatus.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
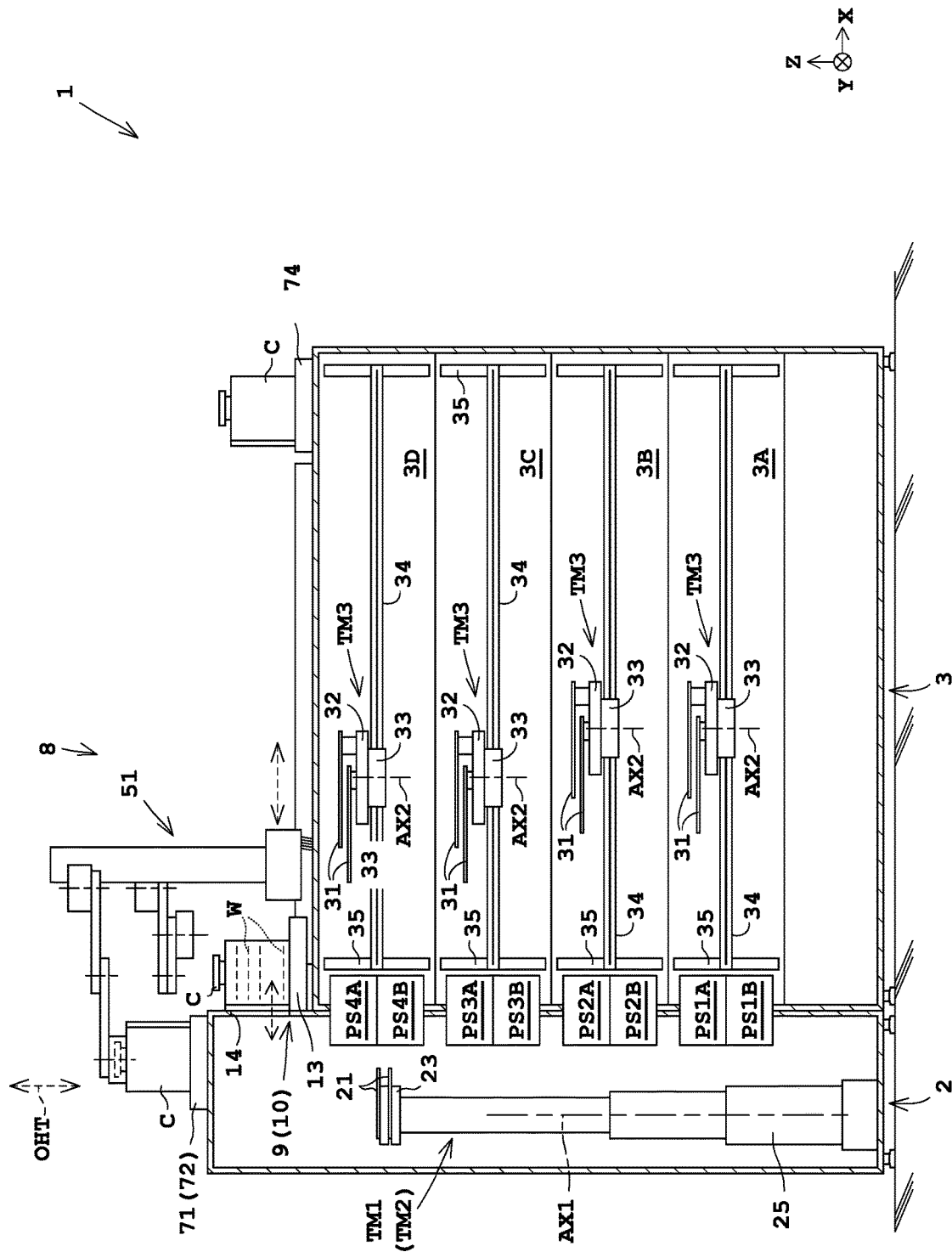
FIG. 1 is a longitudinal cross-sectional view of a substrate treating apparatus according to a first embodiment.
Figure 2A:
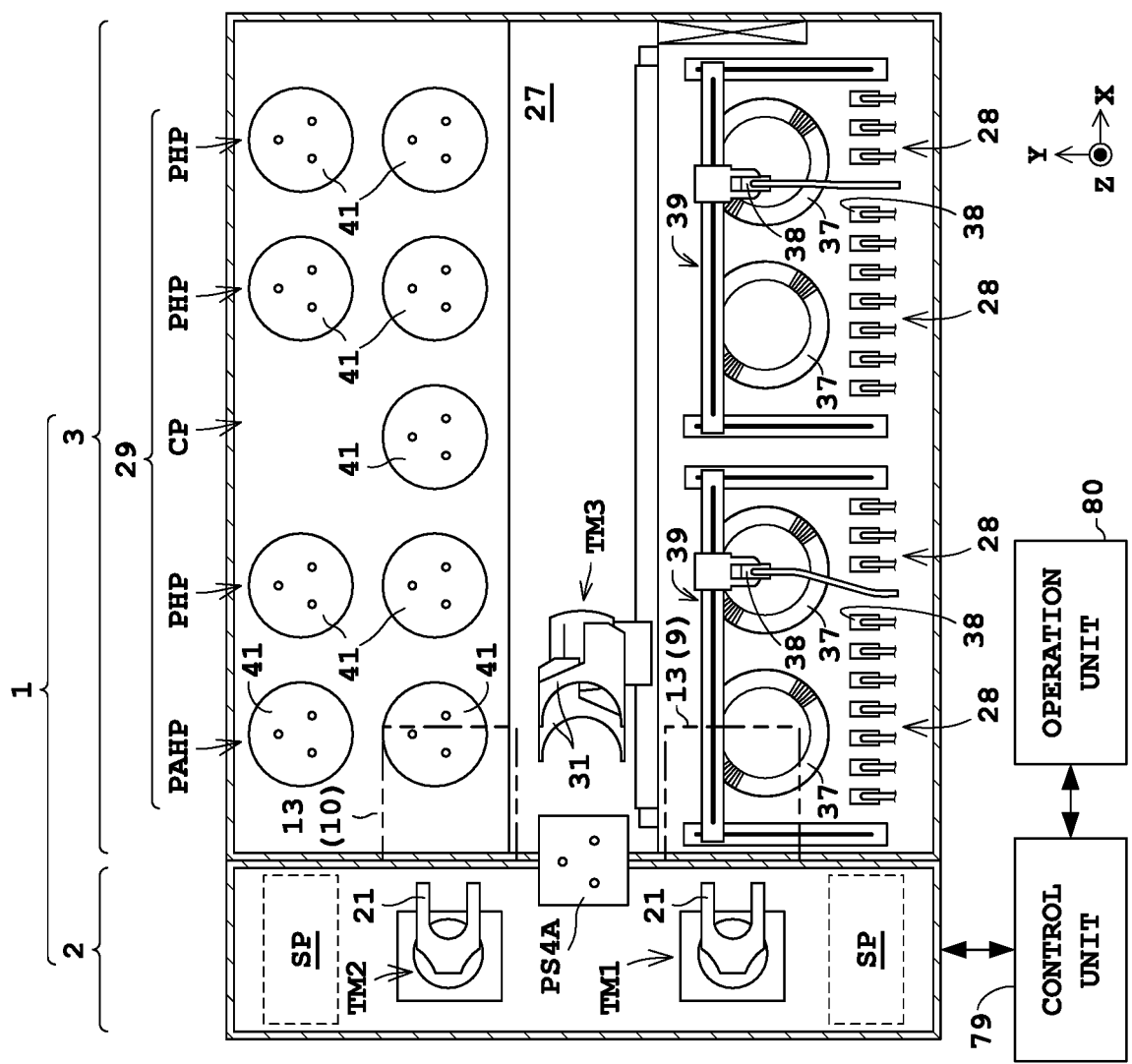
FIG. 2A is a horizontal cross-sectional view of the substrate treating apparatus and FIG. 2B illustrates an opening, a shutter member, and a shutter member drive mechanism according to the first embodiment.
Figure 3:
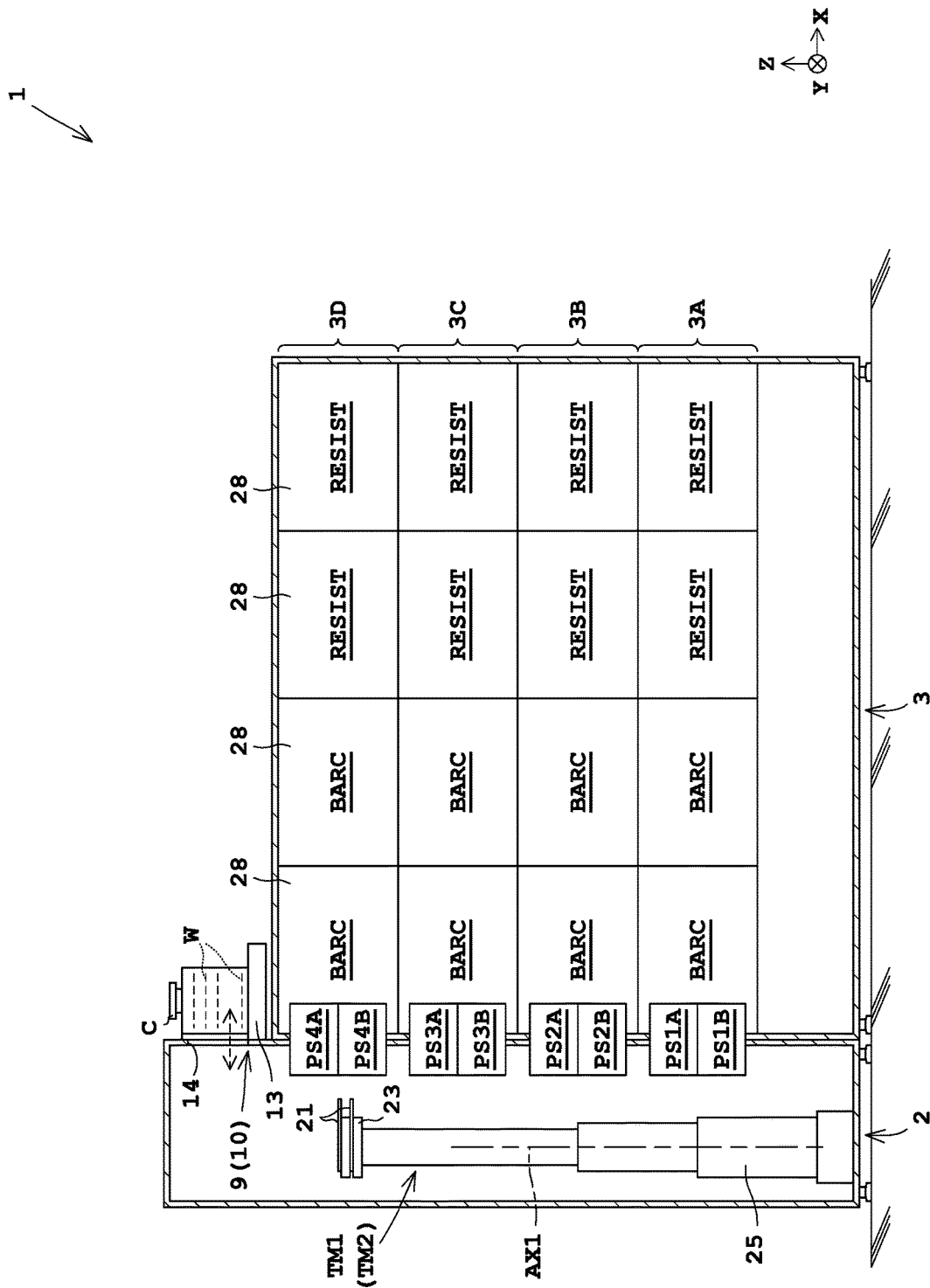
FIG. 3 is a right side view of the substrate treating apparatus according to the first embodiment.
Figure 4:
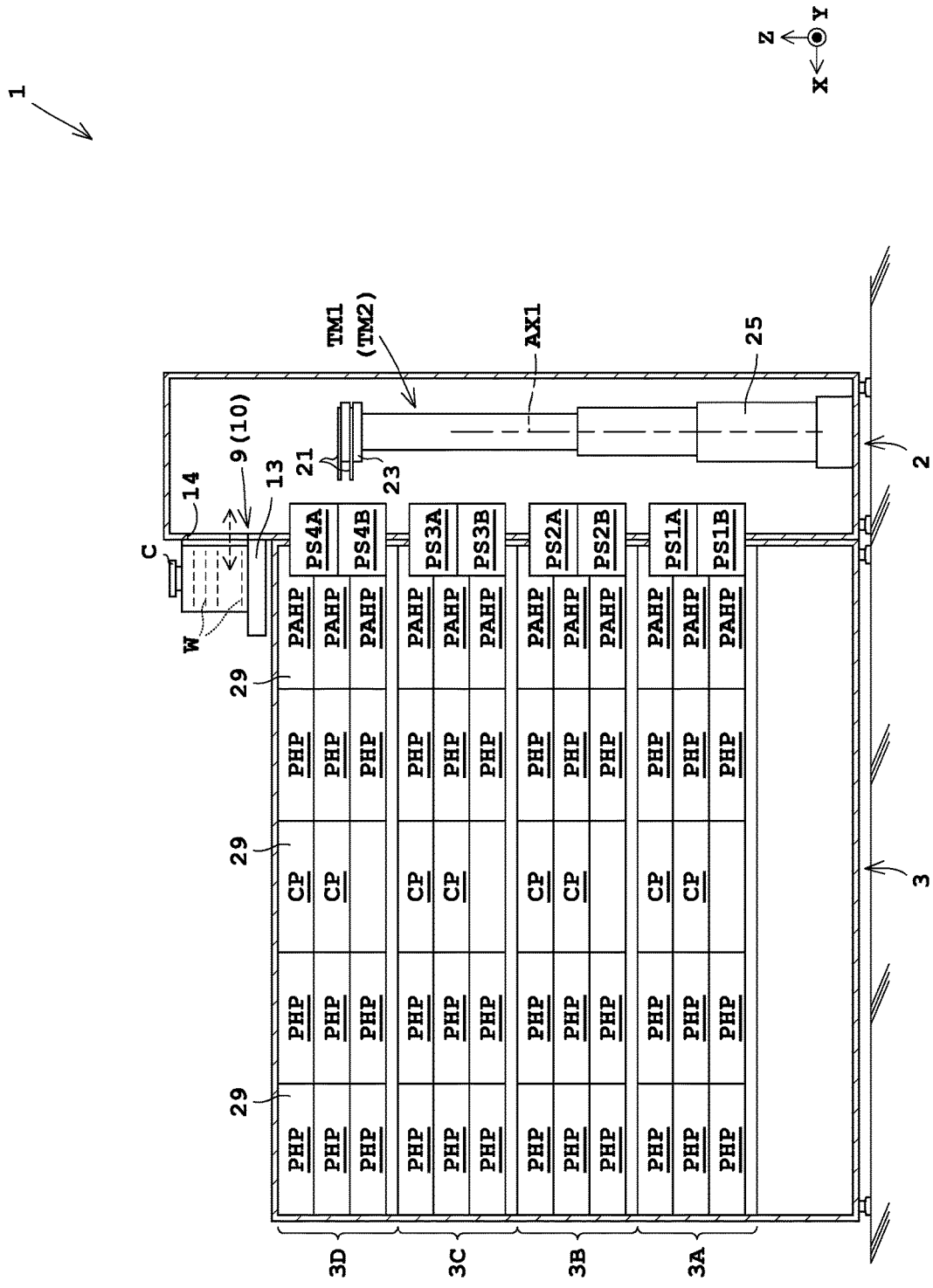
FIG. 4 is a left side view of the substrate treating apparatus according to the first embodiment.

A first embodiment of the present invention will now be described with reference to the drawings. FIG. 1 is a longitudinal cross-sectional view of a substrate treating apparatus according to a first embodiment. FIG. 2A is a horizontal cross-sectional view of the substrate treating apparatus. FIG. 3 is a right side view of the substrate treating apparatus. FIG. 4 is a left side view of the substrate treating apparatus. It should be noted that a substrate platform PS4A is disposed between a liquid treating unit 28 and a heat-treatment unit 29 as illustrated in FIG. 2A, for example. In this regard, FIGS. 3 and 4 each illustrate the substrate platform PS4A in front of the liquid treating unit 28 or the heat-treatment unit 29, for example, for illustration purposes.

<Configuration of Substrate Treating Apparatus 1>

Reference is made to FIGS. 1 and 2A. The substrate treating apparatus 1 includes a first indexer block (hereinafter, referred to as a "first ID block" where appropriate) 2, a first treating block 3, and a carrier buffer device 8.

[Configuration of First Indexer Block 2]

The first ID block 2 includes two openers 9, 10 (see FIG. 2A), and two substrate transport mechanisms (robots) TM1, TM2. The two openers (carrier platforms) 9, 10 provided in the first ID block 2 each include a carrier C placed thereon.

The carrier C is capable of accommodating a plurality of (e.g., 25) substrates W in a horizontal orientation. For instance, a FOUP (Front Open Unified Pod) is used as the carrier C. Alternatively, a container except the FOUP (e.g., a Standard Mechanical Inter Face (SMIF) pod) is usable. The carrier C includes, for example, a carrier body with an opening formed therein through which the substrates W are inserted or taken out and configured to accommodate the substrates W and a lid for covering the opening of the carrier body.

Figure 2B:
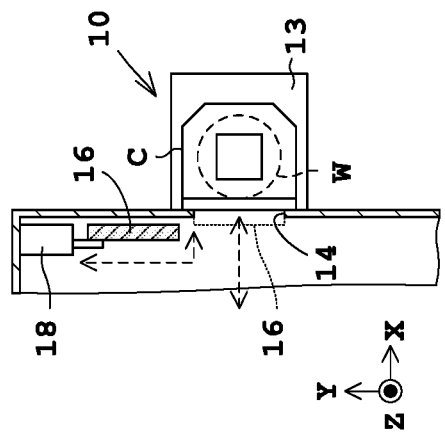

The openers 9, 10 each include a platform 13 on which the carrier C is placed, an opening 14 through which the substrates W pass, a shutter member 16 (see FIG. 2B) configured to open and close the opening 14 and to attach and detach the lid to and from the carrier body, and a shutter member drive mechanism 18 configured to drive the shutter member 16. The shutter member drive mechanism 18 includes an electric motor. Here, the shutter member 16 detaches the lid from the carrier body, and thereafter, moves downwardly or horizontally along the opening 14 (Y-direction), for example.

The platform 13 is disposed on the roof of the treating block 3. As illustrated in FIG. 1, the platform 13 is provided higher in level than the treating block 3, i.e., above the coating block 3. The platform 13 may be provided on the treating block 3, i.e., may contact a top face of the treating block 3. The platform 13 corresponds to a first carrier platform of the present invention. Moreover, the ID block 2 and the first treating block 3 correspond to the substrate treating apparatus body in the present invention.

The two substrate transport mechanisms TM1, TM2 each include two hands 21, a forward/rearward driving unit 23, and a lifting/lowering rotation driving unit 25. Each of the two hands 21 holds the substrate W. Moreover, each of the two hands 21 is movably attached to the forward/rearward driving unit 23. The forward/rearward driving unit 23 is capable of moving the two hands 21 into the carrier C simultaneously. Moreover, the forward/rearward driving unit 23 is capable of moving the two hands 21 forward and backward individually. Accordingly, the forward/rearward driving unit 23 is capable of moving one of the two hands 21 into the carrier C.

The lifting/lowering rotation driving unit 25 lifts, lowers, and rotates the forward/rearward driving unit 23 to thereby lift, lower, and rotate the two hands 21. In other words, the lifting/lowering rotation driving unit 25 allows the forward/rearward driving unit 23 to move in an upward/downward direction (Z-direction) and to rotate the forward/rearward driving unit 23 about a vertical axis AX1. The forward/rearward driving unit 23 and the lifting/lowering rotation driving unit 25 each include an electric motor. The two substrate transport mechanisms TM1, TM2 are fixed on a floor of the first ID block 2 individually so as not to move horizontally (especially, Y-direction).

Four substrate platforms PS1A to PS4A for sending and four substrate platforms PS1B to PS4B for return are disposed between the first ID block 2 and four treatment layers 3A to 3D mentioned later. Here, the eight substrate platforms PS1A to PS4A, PS1B to PS4B may place only one substrate W or two or more substrates W thereon. Also, such as a substrate platform (e.g., a substrate platform PS11 or a mounting-cum-cooling unit P-CP) mentioned later may place only one substrate W or two or more substrates W thereon.

The first substrate transport mechanism TM1 is capable of transporting a substrate W between the carrier C placed on the opener 9 and the eight substrate platforms PS1A to PS4A, PS1B to PS4B. The second substrate transport mechanism TM2 is capable of transporting a substrate W between the carrier C placed on the opener 10 and the eight substrate platforms PS1A to PS4A, PS1B to PS4B. Here, the first substrate transport mechanism TM1 is incapable of taking and accommodating the substrate W from and into the carrier C placed on the opener 10. Moreover, the second substrate transport mechanism TM2 is incapable of taking and accommodating the substrate W from and into the carrier C placed on the opener 9.

[Configuration of First Treating Block 3]

The first treating block 3 is connected to the first ID block 2 horizontally. The first treating block 3 performs a coating treatment on the substrates W.

The first treating block 3 includes four treatment layers 3A to 3D. The four treatment layers 3A to 3D are laminated in the upward/downward direction (Z-direction). The four treatment layers 3A to 3D each include a third substrate transport mechanism TM3, a transportation space 27, a liquid treating unit 28, and a heat-treatment unit 29. The four treatment layers 3A to 3D are configured in the same manner as one another.

The third substrate transport mechanism TM3 is configured to transport the substrates W in each of the treatment layers 3A to 3D. The third substrate transport mechanism TM3 includes two hands 31, a forward/rearward driving unit 32, a rotation driving unit 33, a first movement mechanism 34, and a second movement mechanism 35.

Each of the two hands 31 holds the substrate W. Moreover, each of the two hands 31 is movably attached to the forward/rearward driving unit 32. The forward/rearward driving unit 32 moves the two hands 31 forward and backward individually. The rotation driving unit 33 causes the forward/rearward driving unit 32 to rotate about a vertical axis AX2. Accordingly, the orientation of each of the two hands 31 can be changed. The first movement mechanism 34 moves the rotation driving unit 33 in the forward/rearward direction (X-direction) as in FIG. 1. Accordingly, the forward/rearward driving unit 32 can be moved in the X-direction. The second movement mechanism 35 moves the first movement mechanism 34 in the upward/downward direction (Z-direction). Accordingly, the forward/rearward driving unit 32 can be moved in the Z-direction.

Each of the forward/rearward driving unit 32, the rotation driving unit 33, the first movement mechanism 34, and the second movement mechanism 35 includes an electric motor.

As illustrated in FIG. 2A, the third substrate transport mechanism TM3 is disposed in the transportation space 27. The transportation space 27 is configured to extend in the horizontal direction (X-direction) linearly. The liquid treating unit 28 and the heat-treatment unit 29 are disposed to sandwich the transportation space 27.

FIG. 3 is a right side view illustrating arrangement of the liquid treating unit 28 of the first treating block 3. Each of the four coating-treatment layers 3A to 3D includes four liquid treating units 28. The four liquid treating units 28 are arranged in four lines in the horizontal direction and one level in the upward/downward direction, that is, the liquid treating units 28 are arranged in 4 lines×1 levels. Of the four liquid treating units 28, the two liquid treating units 28 adjacent to the first ID block 2 are each a coating unit BARC. The other two liquid treating units 28 are each a coating unit RESIST. The coating unit BARC forms an antireflection film on the substrate W. The coating unit RESIST forms a resist film, such as a photoresist, on the substrate W.

As illustrated in FIG. 2A, the liquid treating unit 28 includes a holding rotation portion 37, nozzles 38, and a nozzle moving mechanism 39. The holding rotation portion 37 holds lower faces of the substrates W by, for example, vacuum adsorption and rotates the substrates W held by the holding rotation portion 37 about the vertical axis (Z-direction). The rotation is performed by an electric motor, for example. The nozzles 38 are configured to supply a coating solution (e.g., a solution for forming an anti-reflection film or a photoresist solution) to the substrates W. The nozzle moving mechanism 39 is configured to move the nozzles 38 to any positions. The nozzle moving mechanism 39 includes an electric motor, for example.

FIG. 4 is a left side view illustrating arrangement of the heat-treatment unit 29 of the first treating block 3. Each of the treatment layers 3A to 3D includes a plurality of heat-treatment units 29. The heat-treatment unit 29 performs a heat treatment, and includes a plate 41 (see FIG. 2A) on which the substrate W is placed. For instance, the plate 41 is heated with a heater, and is cooled with a water-cooled mechanism.

The heat-treatment units 29 are arrangeable in five lines× three levels in the four treatment layers 3A to 3D. In FIG. 4, each of the four treatment layers 3A to 3D includes fourteen heat-treatment units 29. That is, each of the four treatment layers 3A to 3D includes three adhesion enhancing treatment units PAHP, two cooling units CP, and nine heating/cooling units PHP. It should be noted that, in the first treating block 3, the numbers and types of the liquid treating units 28, the heat-treatment units 29, and other treating units are variable where appropriate. For instance, the treating unit may include an edge exposing unit EEW configured to expose a peripheral edge of the substrate W.

The adhesion enhancing treatment units PAHP are configured to apply an adhesion enhancing agent such as hexamethyldisilazane (HMDS) to substrates W and heats the resulting substrates W to thereby enhance adhesion between the substrates W and the antireflection films. The adhesion enhancing treatment units PAHP also have the function of cooling the substrates W after heating. The cooling units CP cool the substrates W. The heating/cooling units PHP sequentially perform heating and cooling in this order.

[Carrier Buffer Device 8]

Figure 5:
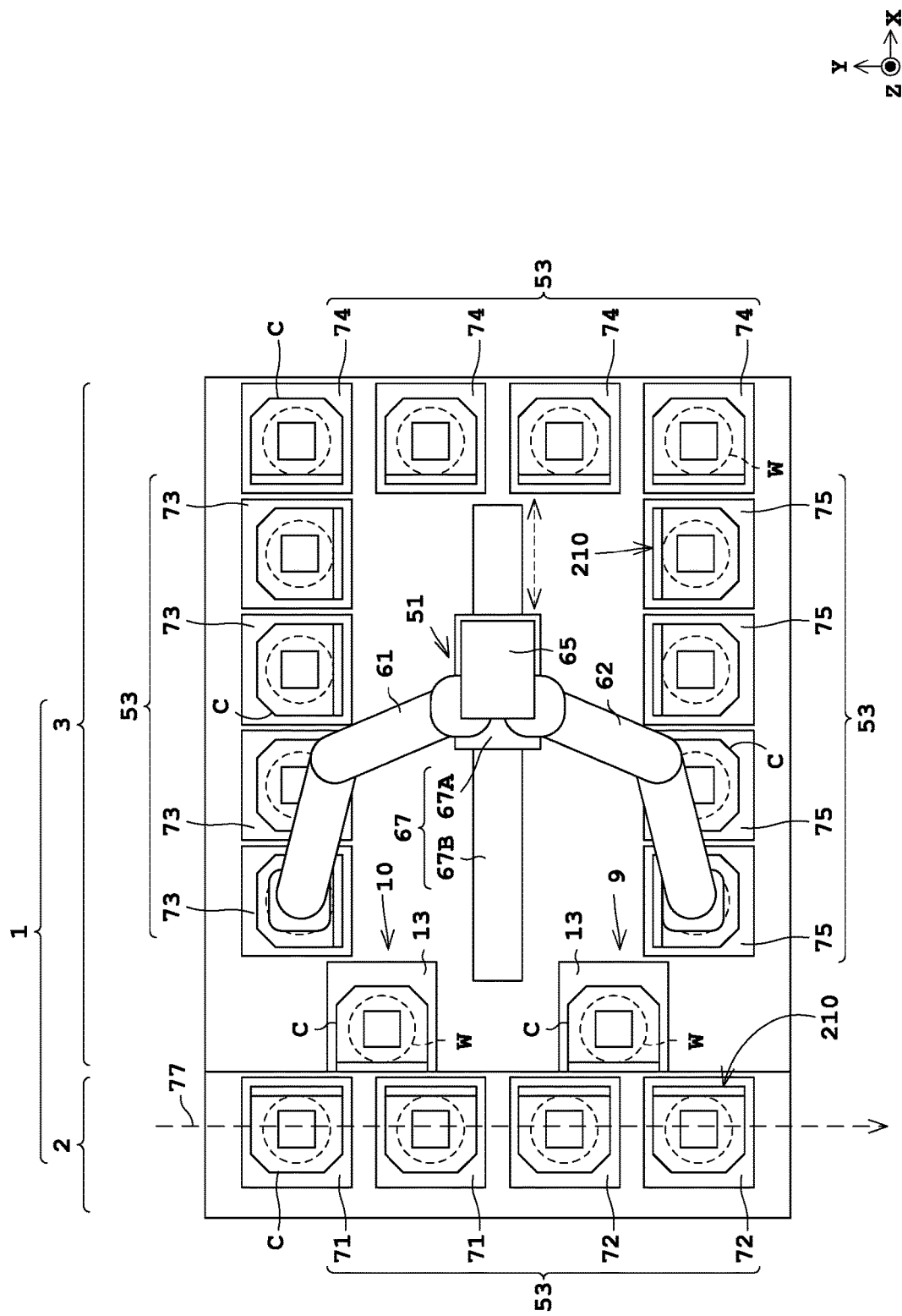
FIG. 5 is a plan view of a carrier buffer device according to the first embodiment.

The carrier buffer device 8 is mounted on the first ID block 2 and the treating block 3, for example. As illustrated in FIG. 5, the carrier buffer device 8 includes a carrier transport mechanism 51 and carrier storage shelves 53.

Figure 6:
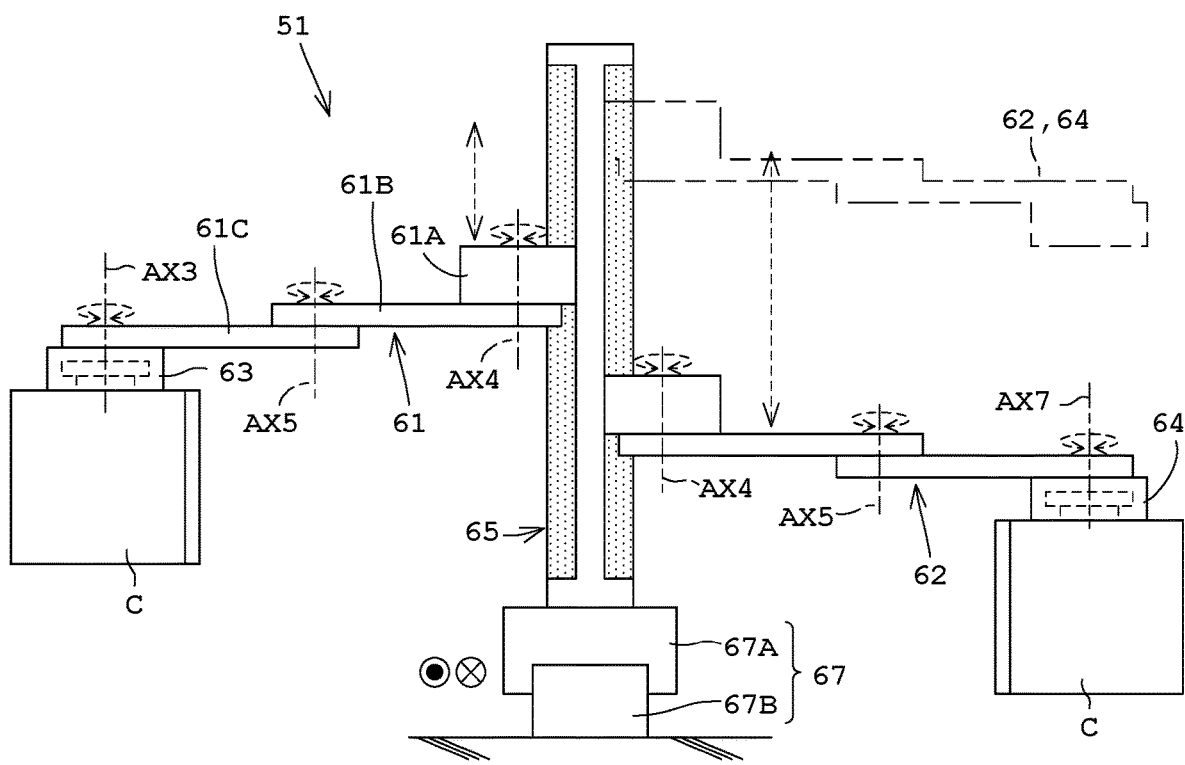
FIG. 6 illustrates a carrier transport mechanism.

Reference is made to FIG. 6. FIG. 6 illustrates the carrier transport mechanism 51. The carrier transport mechanism 51 includes two articulated arms 61, 62. The first articulated arm 61 includes a first end with a gripper 63, and a second articulated 62 includes a first end with a gripper 64. Moreover, the first articulated arm 61 includes a second end supported on a strut lifting/lowering driving unit 65 so as to be movable in the upward/downward direction. The second articulated arm 62 includes a second end supported on the lifting/lowering driving unit 65 so as to be movable in the upward/downward direction.

Each of the two grippers 63, 64 is configured to grasp a projection provided on a top face of the carrier C, for example. The two grippers 63, 64 each include an electric motor.

The two articulated arms 61, 62 each include one electric motor or two or more electric motors. The first articulated arm 61 is configured to make the first gripper 63 to be rotatable to 360 degrees about a vertical axis AX3. The first articulated arm 61 includes three arm members 61A to 61C, for example, and the arm member 61A is supported on the lifting/lowering driving unit 65 mentioned later so as to be movable upwardly/downwardly. The two arm members 61A, 61B are connected in a rotatable manner around a vertical axis AX4. Moreover, the two arm members 61B, 61C are connected in a rotatable manner around a vertical axis AX5. The second articulated arm 62 is configured in the same manner as the first articulated arm 61. For instance, the first articulated arm 61 may be in charge of transporting the carrier C on the upper side in FIG. 5, whereas the second articulated arm 62 may be in charge of transporting the carrier C on the lower side in FIG. 5.

The lifting/lowering driving unit 65 is configured to make the two articulated arms 61, 62 to be liftable individually. Accordingly, the first articulated arm 61 may be moved to a position higher than that of the second articulated arm 62, or the first articulated arm 61 may be moved to a position lower than that of the second articulated arm 62. The lifting/lowering driving unit 65 includes an electric motor. The lifting/lowering driving unit 65 may include a belt and a plurality of pulleys, for example, for one articulated arm. Here, the lifting/lowering driving unit 65 may be configured to cause the two articulated arms 61, 62 to lift integrally.

A forward/backward driving unit 67 includes a supporting portion 67A configured to support the lifting/lowering driving unit 65, a longitudinal portion 67B extending longitudinally in the forward/rearward direction (X-direction), and an electric motor (not shown). For instance, the longitudinal portion 67B may be a rail (guide rail) and the supporting portion 67A may be a carriage. In this case, the electric motor may cause the carriage (supporting portion 67A) to move along the rail (longitudinal portion 67B).

Moreover, the electric motor, the pulleys, the belt, and the guide rail may be accommodated in the longitudinal portion 67B, and the supporting portion 67A may be fixed to the belt, for example. In this case, the electric motor may cause the pulleys to rotate to move the belt on the pulleys, whereby supporting portion 67A is moved along the guide rail. Moreover, the electric motor, a screw shaft, and the guide rail may be accommodated in the longitudinal portion 67B, and a nut configured to engage with the screw shaft may be provided in the supporting portion 67A, for example. In this case, the electric motor may cause the screw shaft to rotate to move the supporting portion 67A along the guide rail.

The forward/backward drive unit 67 is capable of enlarging a carrier transporting area by the carrier transport mechanism 51, and also is capable of installing more carrier storage shelves 53 as the carrier transporting area is larger.

Reference is made again to FIG. 5. The carrier storage shelf 53 includes input ports 71, output ports 72, untreated substrate carrier shelves 73, empty carrier shelves 74, and treated substrate carrier shelves 75. The input ports 71 are each a shelf for receiving the carrier C where untreated substrates W are accommodated from an external transport mechanism OHT (overhead hoist transport). The external transport mechanism OHT transports a carrier C in the factory. The term untreated means the condition where the first treating block 3 performs no treatment in this embodiment. As illustrated in FIGS. 1 and 5, the input port 71 is provided on the first ID block 2, i.e., on the roof of the first ID block 2. A rail 77 for the external transport mechanism OHT is provided above the first ID block 2. The external transport mechanism OHT transports a carrier C to one of the two input ports 71.

The untreated substrate carrier shelf 73 accommodates a carrier C which was placed on the input port 71, not transported to either of the two platforms 13, and accommodating untreated substrates W. The empty carrier shelf 74 accommodates a carrier C from which all the substrates W are taken on the platform 13. The treated substrate carrier shelf 75 accommodates a carrier C accommodating treated substrates W and not capable of being transported to either of the two output ports 72. The term treated means the condition where the first treating block 3 performs any treatment in the first embodiment.

The output port 72 is a shelf for delivering a carrier C where the treated substrates W are accommodated to the external transport mechanism OHT. As illustrated in FIGS. 1 and 5, the output port 72 is provided on the first ID block 2, i.e., on the roof of the first ID block 2. The carrier transport mechanism 51 allows a carrier C to move freely among the platform 13 and the shelves 71 to 75.

The carrier transport mechanism 51 includes the two-paired articulated arms and grippers. Alternatively, one-paired articulated arm and gripper, or three or more paired articulated arms and grippers may be provided. Moreover, the lifting/lowering driving unit 65 may be configured to be rotatable about a vertical axis with respect to the supporting portion 67A. Moreover, a rail 77 may pass an area other than the area above the first ID block 2. In this case, input ports 71 and output ports 72 are provided at a position on the apparatus 1 where the OHT passes above the apparatus 1. Moreover, the rail 77 on the external transport mechanism OHT may be configured so as to pass above the substrate treating apparatus 1 twice or more. For instance, the carrier transport mechanism 51 may be provided on the first treating block 3 via some layer. The number and types of the carrier storage shelves 53 are variable where appropriate.

Moreover, as illustrated in FIG. 2A, the substrate treating apparatus 1 includes one or more control units 79 and an operation unit 80. Each of the control units 79 includes, for example, a central processing unit (CPU). The control units 79 control components of the substrate treating apparatus 1. The operation unit 80 includes a display unit (e.g., liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1. Here, a circuit board including a controller 79, for example, may be provided in a space SP of the first ID block 2 illustrated in FIG. 2A. Moreover, in the space SP, an inversion unit configured to inverse the substrate W (front and rear faces of the substrate W) individually or in addition to the circuit board.

<Operation of Substrate Treating Apparatus 1>

An operation of the substrate treating apparatus 1 will now be described. Firstly, description will be given of operations of the carrier transport mechanism 51 with reference to FIG. 5. Here, it is assumed that the opener 10 is used for taking substrates W from a carrier C and the opener 9 is used for returning the substrates W to the carrier C, for example.

[Step S01] Transport of Carrier C from Input Port 71 to Opener 10

The external transport mechanism OHT moves along the rail 77, and transports a carrier C, where untreated substrates W are accommodated, to one of the two input ports 71. The carrier transport mechanism 51 moves the carrier C, transported to the input port 71, to the platform 13 of the opener 10. If the carrier transport mechanism 51 is incapable of transporting the carrier C to the platform 13 of the opener 10, the carrier transport mechanism 51 transports the carrier C from the input port 71 to one of four untreated substrate carrier shelves 73. Moreover, if the transport mechanism 51 is incapable of transporting the carrier C to all the four untreated substrate carrier shelves 73, the carrier C is caused to be in a standby state in the input port 71. Basically, the substrates W accommodated in the carrier C in order of being transported into the input port 71 are treated in the first treating block 3.

[Step S02] Transport of Carrier C from Opener 10 to Opener 9

The second substrate transport mechanism TM2 of the first ID block 2 takes a substrate W from the carrier C transported to the platform 13 of the opener 10, and transports the taken substrate W to the first treating block 3. The carrier transport mechanism 51 transports the empty carrier C, from which all the substrates W are taken, to the platform 13 of the opener 9. If the carrier transport mechanism 51 is incapable of transporting the empty carrier C to the platform 13 of the opener 9, the carrier transport mechanism 51 transports the carrier C to one of the four empty carrier shelves 74. Moreover, if the carrier transport mechanism 51 is incapable of transporting the empty carrier C to any of the empty carrier shelves 74, the empty carrier C is caused to be in a standby state on the platform 13 of the opener 10.

[Step S03] Transport of Carrier C from Opener 9 to Output Port 72

The first substrate transport mechanism TM1 of the first ID block 2 accommodates the substrate W, treated in the treating block 3, into the carrier C transported onto the platform 13 of the opener 9. The carrier transport mechanism 51 transports the carrier C where all the substrates W are accommodated to one of the two output ports 72. If the carrier transport mechanism 51 is incapable of transporting the carrier C to any of the two output ports 72, the carrier transport mechanism 51 transports the carrier C from platform 13 of the opener 9 to one of the four treated substrate carrier shelves 75. Moreover, if the transport mechanism 51 is incapable of transporting the carrier C to any of the four treated substrate carrier shelves 75, the carrier C is caused to be in a standby state on the platform 13 of the opener 9.

Thereafter, the external transport mechanism OHT moves along the rail 77, and transports the carrier C, where the treated substrates W are accommodated, from one of the two input ports 72 to a next target.

An entire operation of the substrate treating apparatus 1 will now be described. Reference is made to FIG. 1. The external transport mechanism OHT transports carrier C to the input ports 71 provided on the first ID block 2. The carrier transport mechanism 51 transports the carrier C from the input port 71 to the platform 13 of the opener 10. The shutter member of the opener 10 opens the opening 14 while removing and holding the lid of the carrier C.

[Step S11] First ID Block 2

The first ID block 2 takes a substrate W from the carrier C placed on the platform 13 of the opener 10 and sends the taken substrate W to one of the four treatment layers 3A to 3D. For instance, the second substrate transport mechanism TM2 takes a substrate W from the carrier C placed on the platform 13 of the opener 10. The second substrate transport mechanism TM2 transports the taken substrate W to the substrate platform PS1A. Moreover, the second substrate transport mechanism TM2 transports the taken substrates W to the treatment layers 3A to 3D, for example, in substantially the even manner.

When all the substrates W are taken from the carrier C, the opener 10 closes the opening 14 with the shutter member while attaching the lid to the carrier C. Thereafter, the carrier transport mechanism 51 replaces the empty carrier C, from which the substrates W are taken out, by another carrier C accommodating untreated substrates W. Thereafter, the carrier transport mechanism 51 transports the empty carrier C to the platform 13 of the opener 9, for example. If the carrier transport mechanism 51 is incapable of transporting the empty carrier C to the opener 9, the carrier transport mechanism 51 transports the empty carrier C to one of the four empty carrier shelves 74.

[Step S12] First Treating Block 3

The treatment layers 3A to 3D of the first treating block 3 each perform a coating treatment on the sent substrate W and return the substrate W subjected to the coating treatment to the first ID block 2. Detailed description is as under.

For instance, in the treatment layer 3A of the treating block 3, the third substrate transport mechanism TM3 receives a substrate W from the substrate platform PS1A. The third substrate transport mechanism TM3 transports the received substrate W to an adhesion enhancing treatment unit PAHP, a cooling unit CP, and a coating unit BARC, illustrated in FIG. 3 or 4, in this order. Thereafter, the third substrate transport mechanism TM3 transports the substrate W on which an antireflection film is formed by the coating unit BARC, to a heating/cooling unit PHP, a cooling unit CP, a coating unit RESIST, and a heating/cooling unit PHP in this order. Thereafter, the third substrate transport mechanism TM3 transports the substrate W on which a resist film is formed by the coating unit RESIST to the substrate platform PS1B. The treatment layers 3B to 3D each perform the coating treatment on the sent substrate W similarly to the treatment layer 3A.

[Step S13] First ID Block 2

The first ID block 2 accommodates the substrate W, treated in any of the treatment layers 3A to 3D, to the carrier C placed on the platform 13 of the opener 9. Detailed description is as under. The carrier C on the platform 13 includes the opening kept in an opened state by the opener 9. The first substrate transport mechanism TM1 receives the substrate W from a substrate platform PS1B, for example, and returns the received substrate W to the carrier C placed on the platform 13 of the opener 9. Here, the substrate W is returned to the carrier C where the substrate W was accommodated prior to the coating treatment. In other words, the substrate W is returned to the first carrier C.

When all the treated substrates W are accommodated in the carrier C, the opener 9 closes the opening 14 while attaching the lid to the carrier C. The carrier transport mechanism 51 transports the carrier C where the treated substrates W are accommodated from the platform 13 of the opener 9 to the output port 72. Thereafter, the external transport mechanism OHT transports the carrier C from the output port 72 to a next target.

According to this embodiment, the carrier transport mechanism 51 transports the carrier C between the platforms 13 of the two openers 9, 10 and the carrier storage shelves 53. The carrier storage shelves 53 and the carrier transport mechanism 51 are each mounted on a first treating block 3. Accordingly, there is no need as before to provide the carrier storage shelves 53 and the carrier transport mechanism 51 horizontally in an extended manner from the indexer block, achieving reduction in installation area extending horizontally. In other words, reduction in footprint of the substrate treating apparatus 1 is obtainable.

Moreover, the platforms 13 of the two openers 9, 10 is provided higher in level than the top face of the first treating block 3. The carrier transport mechanism 51 mounted on the first treating block 3 achieves easy transportation of the carrier C placed on the platform 13.

Moreover, the platforms 13 of the two openers 9, 10 is provided above the first treating block 3. Accordingly, the platform 13 is capable of being directed toward the carrier transport mechanism 51. This makes it easy for the carrier transport mechanism 51 to transport the carrier C placed on the platform 13. Moreover, protrusion of the platform 13 from the ID block 2 is suppressible in plan view, leading to more reduction in footprint of the substrate treating apparatus 1.

Moreover, the substrate treating apparatus 1 includes the opening 14 through which a substrate W passes from a carrier C placed on the platform 13, the shutter member 16 configured to open and close the opening 14, and the shutter member drive mechanism 18 configured to move the shutter member 16 horizontally along the opening 14. Accordingly, a space is obtainable in a lower region of the opening 14 in which a substrate platform is placed, for example.

SECOND EMBODIMENT

A second embodiment of the present invention will now be described with reference to the drawings. Here, the description common to that of the first embodiment is to be omitted.

The substrate treating apparatus 1 according to the first embodiment includes the first ID block 2 and the first treating block 3. In contrast to this, the substrate treating apparatus 1 according to the second embodiment includes a second treating block 5 and an interface block (hereinafter, referred to as an "IF block" where appropriate) 6 in addition to the first ID block 2 and the first treating block 3.

Figure 7:
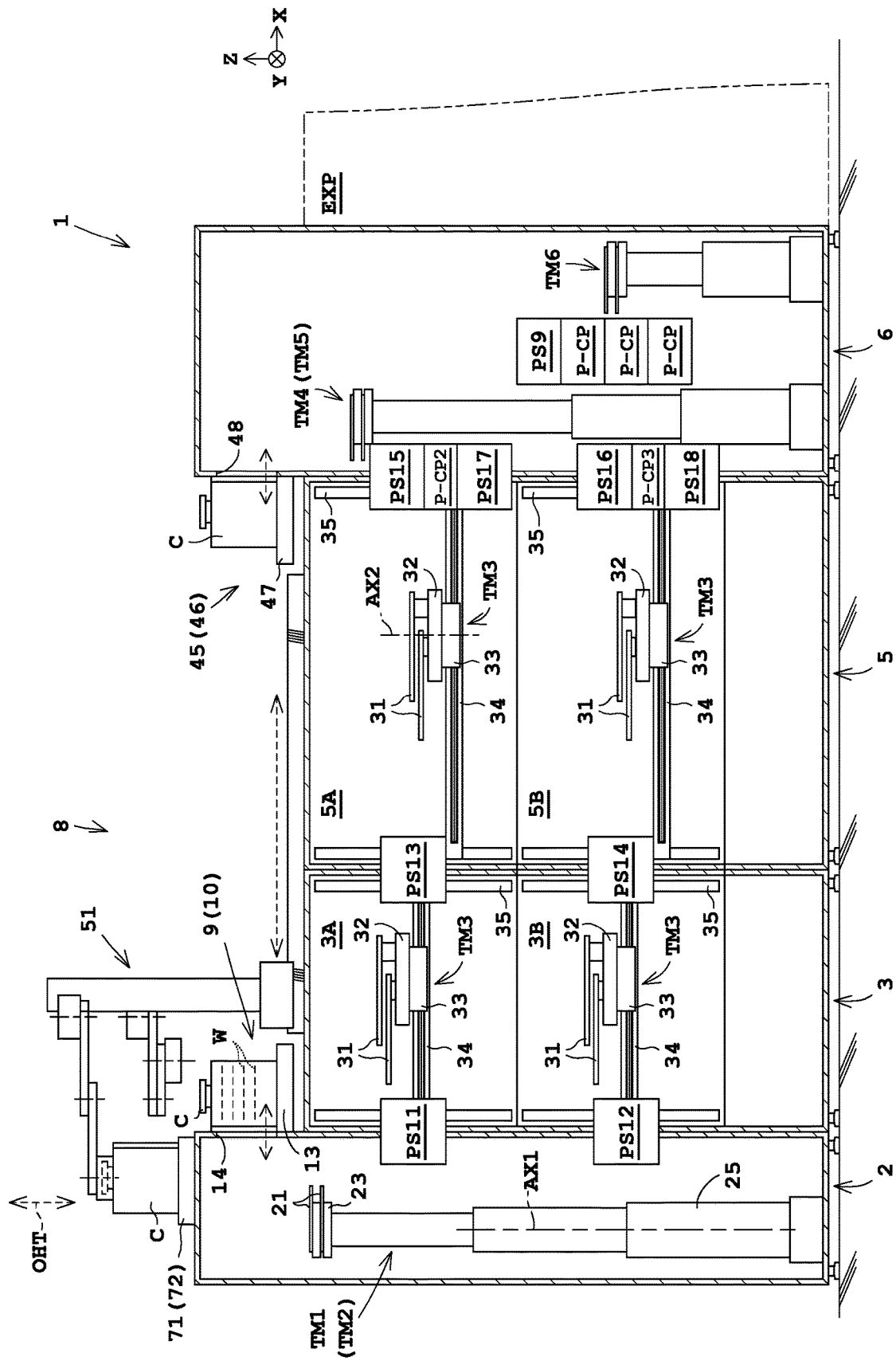
FIG. 7 is a longitudinal cross-sectional view of a substrate treating apparatus according to a second embodiment.
Figure 8:
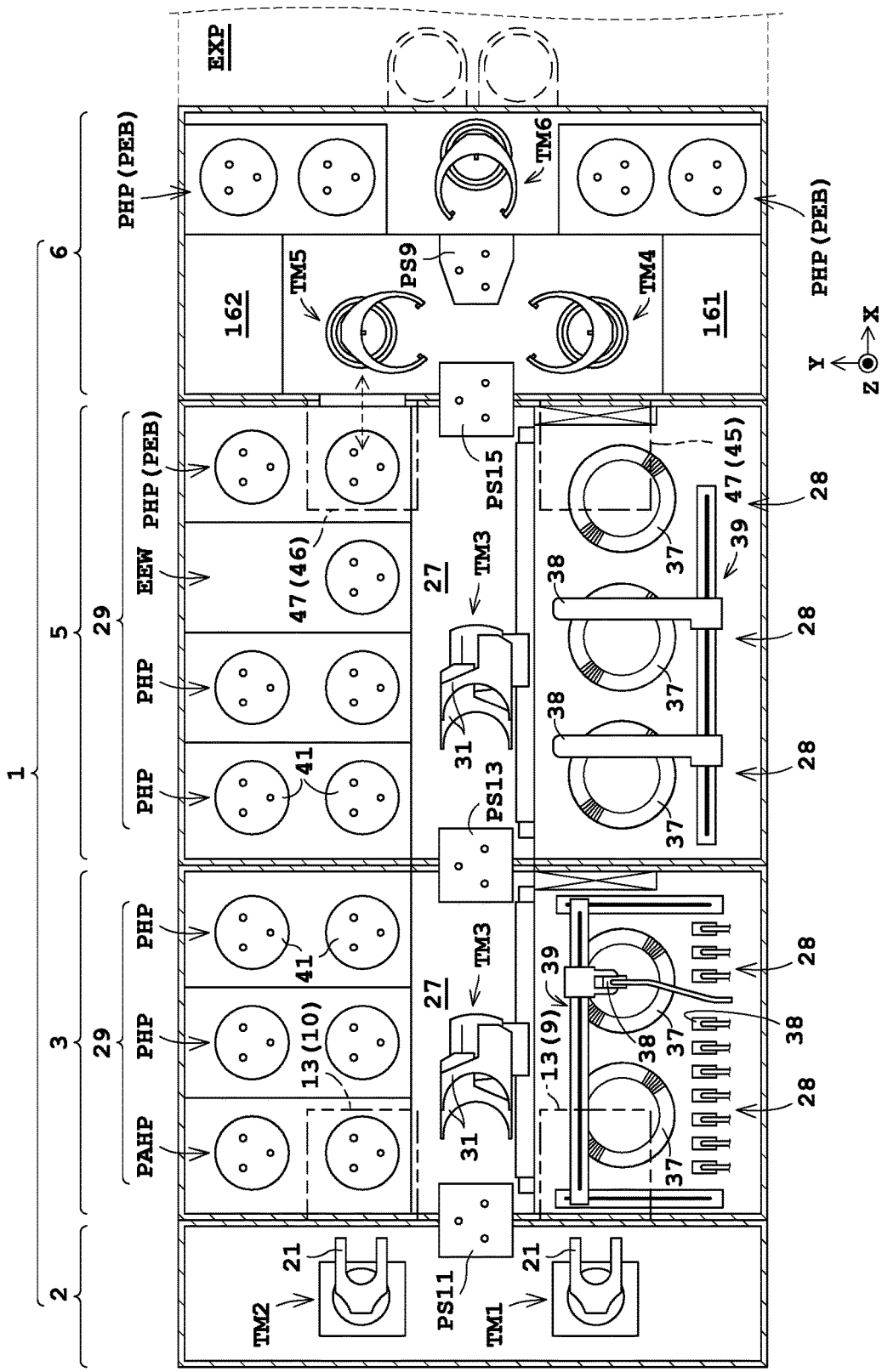
FIG. 8 is a horizontal cross-sectional view of the substrate treating apparatus according to the second embodiment.
Figure 9:
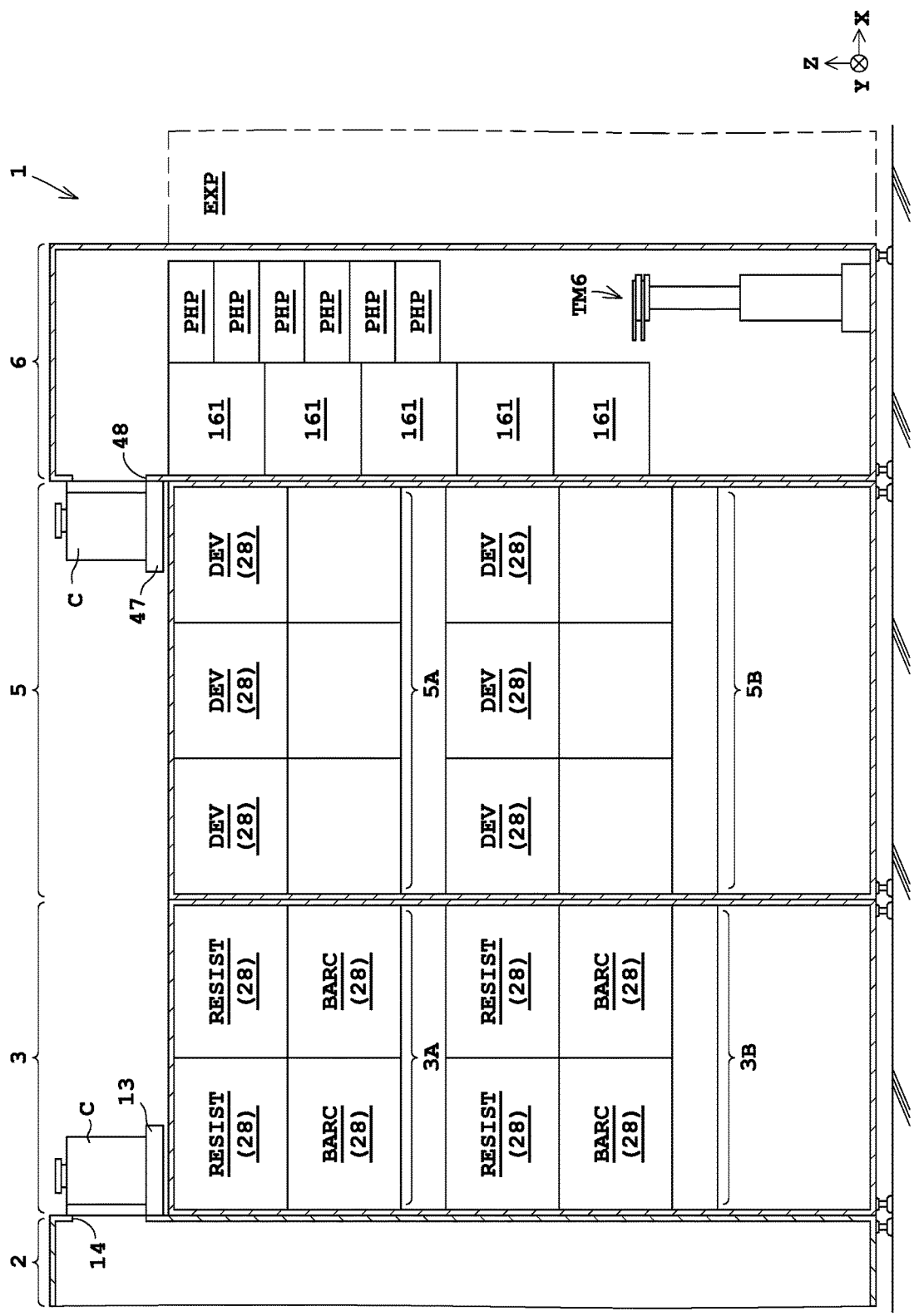
FIG. 9 is a right side view of the substrate treating apparatus according to a second embodiment.
Figure 10:
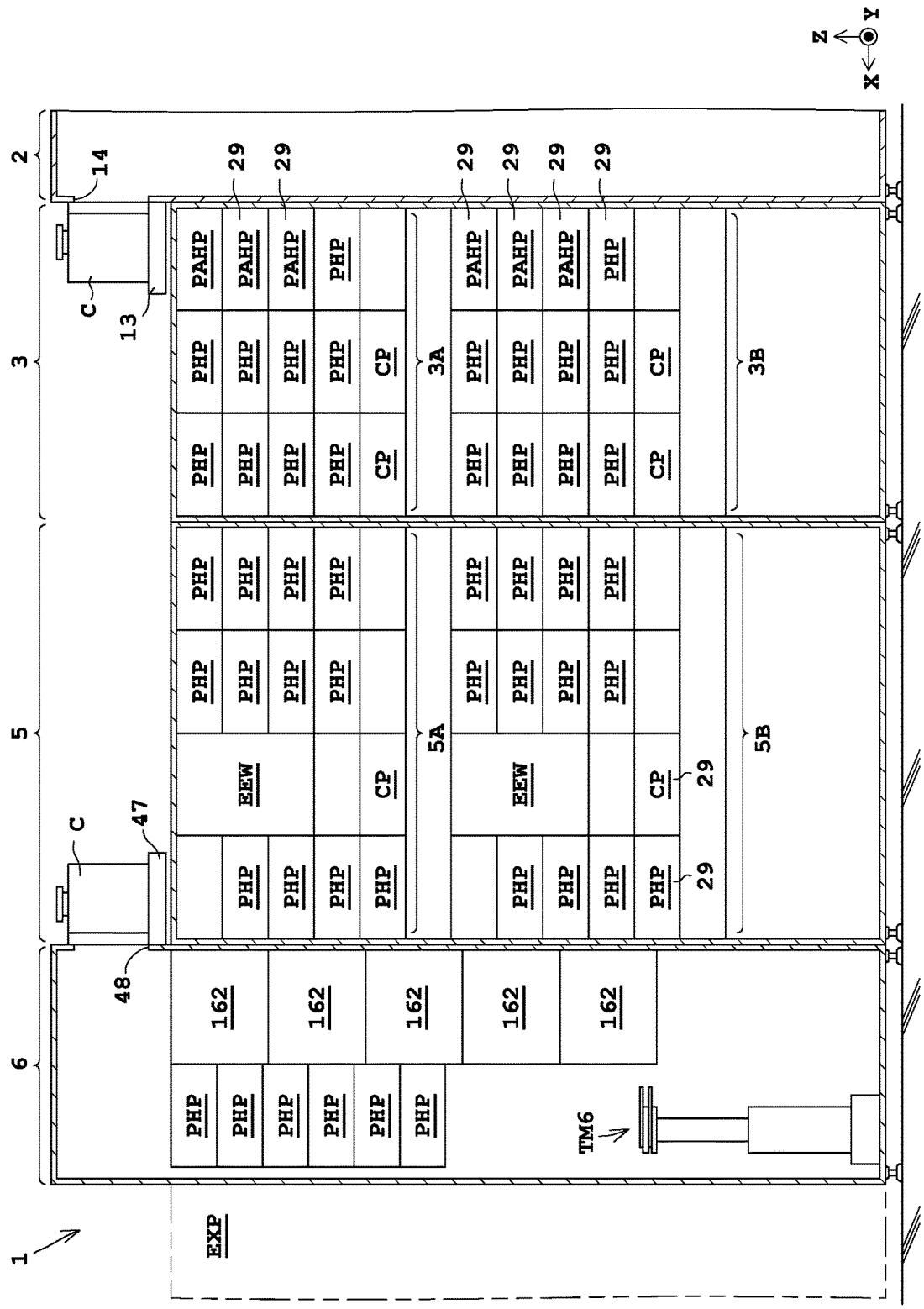
FIG. 10 is a left side view of the substrate treating apparatus according to the second embodiment.

FIG. 7 is a longitudinal cross-sectional view of the substrate treating apparatus 1 according to the second embodiment. FIG. 8 is a horizontal cross-sectional view of the substrate treating apparatus 1. FIG. 9 is a right side view of the substrate treating apparatus 1. FIG. 10 is a left side view of the substrate treating apparatus 1.

Reference is made to FIGS. 7 and 8. The second treating block 5 is connected to the first treating block 3 horizontally. The first treating block 3 performs a coating treatment as a first treatment, and the second treating block 5 performs a developing treatment as a second treatment.

The first treating block 3 includes an upper coating-treatment layer 3A and a lower coating-treatment layer 3B. The second treating block 5 includes an upper developing-treatment layer 5A and a lower developing-treatment layer 5B. The four treatment layers 3A, 3B, 4A, 4B each include a third substrate transport mechanism TM3, a transportation space 27 (see FIGS. 2A, 8), a liquid treating unit 28, and a heat-treatment unit 29.

In FIG. 7, two substrate platforms PS11, PS12 are disposed between the first ID block 2 and two coating-treatment layers 3A, 3B. A substrate platform PS13 is disposed between the upper coating-treatment layer 3A and the upper developing-treatment layer 5A. A substrate platform PS14 is disposed between the lower coating-treatment layer 3B and the lower developing-treatment layer 5B. Moreover, two substrate platforms PS15, PS17 and a mounting-cum-cooling unit P-CP2 are disposed between the upper developing-treatment layer 5A and the IF block 6. Two substrate platforms PS16, PS18 and a mounting-cum-cooling unit P-CP3 are disposed between the lower developing-treatment layer 5B and the IF block 6.

As illustrated in FIG. 9, the four liquid treating units 28 of the first treating block 3 are arranged in two lines in the horizontal direction and two levels in the upward/downward direction, that is, the liquid treating units 28 are arranged in 2 lines×2 levels.

[Configuration of Second Treating Block 5]

As illustrated in FIG. 9, each of the two developing-treatment layers 5A, 5B includes three liquid treating units 28. The three liquid treating units 28 are arranged in three lines×one levels. Moreover, the three liquid treating units 28 are each a developing unit DEV. The developing unit DEV develops the exposed substrate W.

Moreover, as illustrated in FIG. 10, the heat-treatment units 29 are arrangeable in four lines×five levels in the two developing-treatment layers 5A, 5B. Each of the two developing-treatment layers 5A, 5B includes one cooling unit CP, twelve heating/cooling units PHP, and one edge exposing unit EEW. The edge exposing unit EEW exposes a peripheral edge of the substrate W. It should be noted that the numbers and types of the liquid treating units 28, the heat-treatment units 29, and other units are variable where appropriate.

[Interface Block (IF Block) 6]

The IF block 6 is connected to the second treating block 5 horizontally. The IF block 6 is also referred to as the second ID block. The IF block 6 loads and unloads substrates W into and from the exposure device EXP that is configured to perform an exposure treatment as a third treatment. The IF block 6 includes three substrate transport mechanisms TM4 to TM6, a plurality of pre-exposure cleaning units 161, a plurality of post-exposure cleaning units 162, twelve heating/cooling units PHP (PEB), three mounting-cum-cooling units P-CP, and a substrate platform PS9. Moreover, two openers 45, 46 are provided in the IF block 6 (see FIG. 8).

The fourth substrate transport mechanism TM4 and the fifth substrate transport mechanism TM5 are disposed in line in a Y-direction perpendicular with respect to the forward/rearward direction (X-direction). The sixth substrate transport mechanism TM6 is disposed rearward of the two substrate transport mechanisms TM4, TM5 (right side of FIG. 7). The pre-exposure cleaning unit 161 faces the post-exposure cleaning unit 162 across the two substrate transport mechanisms TM4, TM5. The pre-exposure cleaning unit 161 cleans and dries the substrate W prior to an exposure treatment. The post-exposure cleaning unit 162 cleans and dries the substrate W subsequent to the exposure treatment. Each of the cleaning units 161, 162 includes a holding rotation portion configured to hold the substrate W and nozzles through which such as a cleaning liquid and a rinse liquid is dispensed to the substrate W. Moreover, each of the cleaning units 161, 162 may perform polishing to a back face and an edge (bevel portion) of the substrate W with use of a brush and the like. Here, the back face of the substrate W is a face opposite to the face where circuit patterns are formed, for example.

Three mounting-cum-cooling units P-CP and one substrate platform PS9 are surrounded by the three substrate transport mechanisms TM4 to TM6. The three mounting-cum-cooling units P-CP and the one substrate platform PS9 are arranged in the upward/downward direction.

The fourth substrate transport mechanism TM4 is capable of transporting a substrate W among the five substrate platforms PS15 to PS18, PS9, the five mounting-cum-cooling units P-CP, P-CP2, P-CP3, the pre-exposure cleaning unit 161, the heating/cooling units PHP and the carrier C placed on the opener 45. Here, the fourth substrate transport mechanism TM4 is incapable of transporting a substrate W to the carrier C placed on the opener 46 and the post-exposure cleaning unit 162.

The fifth substrate transport mechanism TM5 is capable of transporting a substrate W among the five substrate platforms PS15 to PS18, PS9, the five mounting-cum-cooling units P-CP, P-CP2, P-CP3, the post-exposure cleaning unit 162, the heating/cooling units PHP and the carrier C placed on the opener 46. Here, the fifth substrate transport mechanism TM5 is incapable of transporting a substrate W to the carrier C placed on the opener 45 and the pre-exposure cleaning unit 161.

The sixth substrate transport mechanism TM6 is capable of transporting a substrate W among the substrate platform PS9, the three mounting-cum-cooling units P-CP, and the exterior exposure device EXP. Each of the three substrate transport mechanisms TM4 to TM6 is configured in substantially the same manner as that of the first substrate transport mechanism TM1, for example, and thus the description thereof is to be omitted.

The two openers 45, 46 provided in the IF block 6 each include a carrier C placed thereon. Similarly to the opener 9, the two openers 45, 46 each include a platform 47 on which a carrier C is placed, an opening 48 through which substrates W pass, a shutter member (not shown) configured to open and close the opening 48 and to attach and detach a lid to and from the carrier body, and a shutter member drive mechanism (not shown) configured to drive the shutter member. The shutter member drive mechanism includes an electric motor.

The platforms 47 of the two openers 45, 46 are provided on the roof of the second treating block 5. In FIG. 1, the platform 47 is provided higher in level than the second treating block 5, i.e., above the second treating block 5. The platform 47 may be provided on the second treating block 5, i.e., may contact the second treating block 5. The platform 47 corresponds to a second carrier platform of the present invention.

[Carrier Buffer Device 8]

Figure 11:
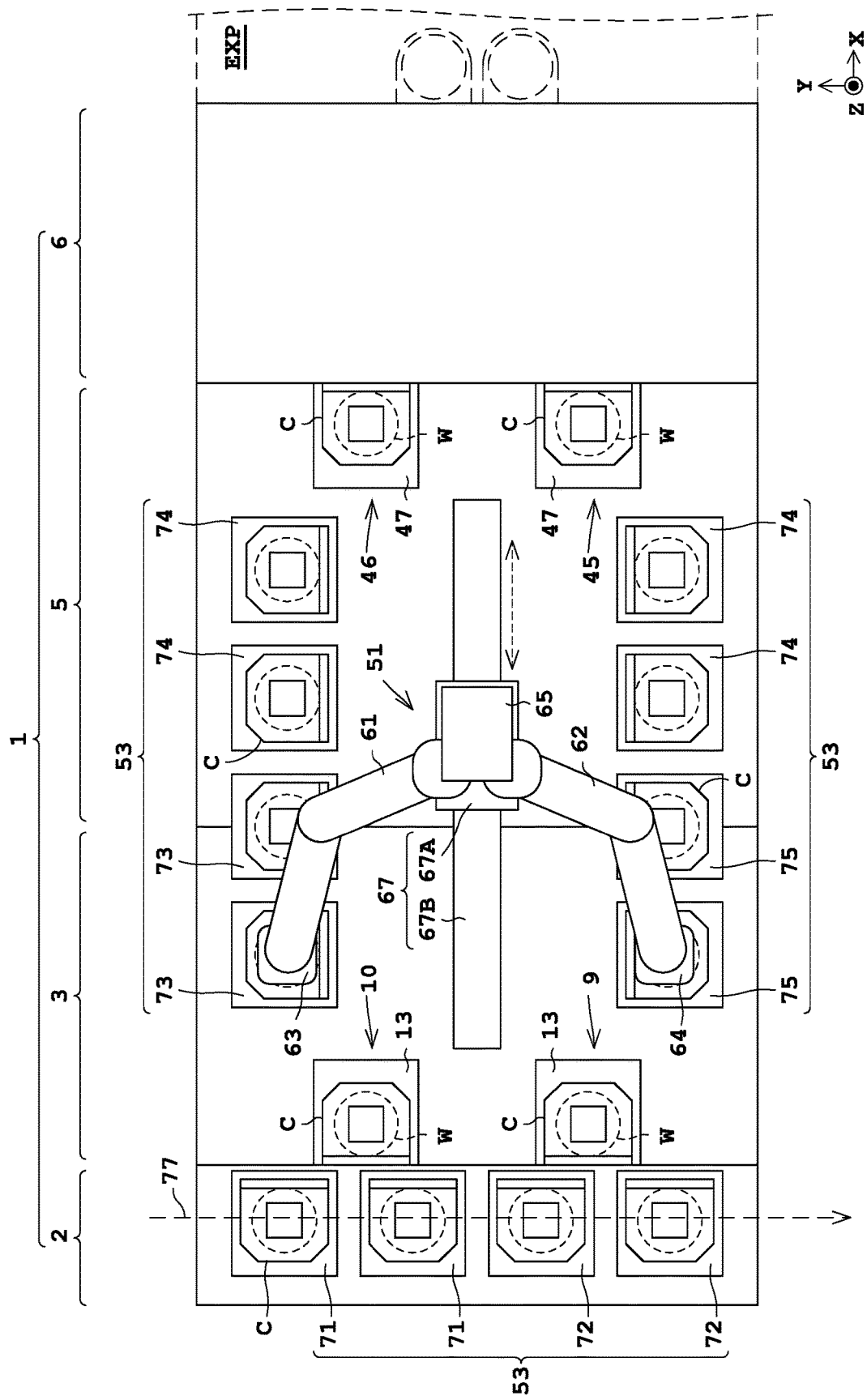
FIG. 11 is a plan view of a carrier buffer device according to the second embodiment.

As illustrated in FIG. 11, the carrier buffer device 8 is mounted on the first ID block 2 and the two treating blocks 3, 5, for example. Here, the carrier buffer device 8 may be mounted on at least any of the first ID block 2, the two treating blocks 3, 5, and the IF block 6.

In FIG. 11, the carrier transport mechanism 51 includes two articulated arms 61, 62 to which grippers 63, 64 are attached, respectively, drive units 65, 67 configured to support the two articulated arms 61, 62, respectively, and a longitudinal portion 67B mounted on the two treating blocks 3, 5. The drive units 65, 67 are configured to cause the two grippers 63, 64 and the two articulated arms 61, 62 to be movable along the longitudinal portion 67B. Here, the longitudinal portion 67B corresponds to the guide rail in the present invention.

<Operation of Substrate Treating Apparatus 1>

An operation of the substrate treating apparatus 1 according to this embodiment will now be described. Here, it is assumed that the two openers 9, 10 are used for taking substrates W from a carrier C and the two openers 45, 46 are used for returning the substrates W to the carrier C.

[Step S21] First ID Block 2

The carrier transport mechanism 51 transports a carrier C from the input port 71 to the platform 13 of the opener 9, for example. The first substrate transport mechanism TM1 of the first ID block 2 takes a substrate W from the carrier C placed on the platform 13 of the opener 9, and transports the taken substrate W to one of the two coating-treatment layers 3A, 3B in the first treating block 3. For instance, the first substrate transport mechanism TM1 transports the substrate W, taken from the carrier C, to the substrate platform PS11.

Here, when all the substrates W are taken from the carrier C, the carrier transport mechanism 51 transports the empty carrier C from the platform 13 to the platform 47 of the opener 45, for example.

[Step S22] First Treating Block 3

The first treating block 3 performs a coating treatment on the substrate W sent from the first ID block 2, and sends the substrate W subjected to the coating treatment to the second treating block 5. Such a step is performed in substantially the same manner as step S12 in the first embodiment, and accordingly, the description thereof is to be omitted. The third substrate transport mechanism TM3 sends the substrate W, subjected to the coating treatment in the coating-treatment layer 3A, to the substrate platform PS13.

[Step S23] Second Treating Block 5

The second treating block 5 does not perform the developing treatment on the substrate W subjected to the coating treatment, but sends the substrate W, sent from the coating-treatment layer 3A of the first treating block 3, to the IF block 6. Specifically, the third substrate transport mechanism TM3 in the upper developing-treatment layer 5A receives the substrate W from the substrate platform PS13, and transports the received substrate W to the substrate platform PS15.

[Step S24] IF Block 6

The IF block 6 unloads the substrate W sent from the second treating block 5 into the exposure device EXP. Then, the IF block 6 loads the substrate W subjected to the exposure treatment from the exposure device EXP, and sends the substrate W subjected to the exposure treatment to the upper developing-treatment layer 5A in the second treating block 5, for example. Detailed description is as under.

For instance, the fourth substrate transport mechanism TM4 in the IF block 6 receives the substrate W from the substrate platform PS15, and transports the received substrate W to the pre-exposure cleaning unit 161 and the mounting-cum-cooling unit P-CP in this order. The sixth substrate transport mechanism TM6 transports the substrate W from the mounting-cum-cooling unit P-CP to the exposure device EXP. The exposure device EXP performs the exposure treatment on the transported substrate W.

The sixth substrate transport mechanism TM6 transports the substrate W exposed by the exposure device EXP from the exposure device EXP to the substrate platform PS9. For instance, the fifth substrate transport mechanism TM5 receives the substrate W from the substrate platform PS9, and transports the received substrate W to the post-exposure cleaning unit 162.

Thereafter, in the configuration illustrated in FIG. 8, the fifth substrate transport mechanism TM5 transports the substrate W directly to the heating/cooling unit PHP in the second treating block 5. Only the fifth substrate transport mechanism TM5 performs access to the heating/cooling unit PHP in the second treating block 5 (basic operation). In this case, the post-exposure cleaning unit 162 is fixed (arranged) adjacent to the fifth substrate transport mechanism TM5, and the pre-exposure cleaning unit 161 is fixed adjacent to the fourth substrate transport mechanism TM4. After the heating/cooling unit PHP in the second treating block 5 treats the substrate W, the third substrate transport mechanism TM3 performs access to the heating/cooling unit PHP and transports the substrate W to the developing unit DEV. Accordingly, the fifth substrate transport mechanism TM5 does not pass through the mounting-cum-cooling unit P-CP2, but transports the substrate W directly to the heating/cooling unit PHP in the developing block 5 in the basic operation. However, if any trouble occurs, the fifth substrate transport mechanism TM5 takes the substrate W from the heating/cooling unit PHP, and transports the substrate W to the substrate platform PS15 or the mounting-cum-cooling unit P-CP2. Then, the third substrate transport mechanism TM3 transports the substrate W to the developing unit DEV. On the other hand, as an optional operation, when the substrate W is transported to the heating/cooling unit PHP via the substrate platform PS15 or the mounting-cum-cooling unit P-CP2, the pre-exposure cleaning unit 161 and the post-exposure cleaning unit 162 may be arranged on both sides (i.e., adjacent to the fourth substrate transport mechanism TM4 and adjacent to the fifth substrate transport mechanism TM5) (see, for example, the post-exposure cleaning unit 162 in FIG. 13).

[Step S25] Second Treating Block 5

The second treating block 5 performs the developing treatment on the substrate W subjected to the exposure treatment, and returns the substrate W subjected to the developing treatment to the IF block 6. For instance, the third substrate transport mechanism TM3 in the developing-treatment layer 5A receives the substrate W from the heating/cooling unit PHP, and transports the received substrate W to the developing unit DEV, the heating/cooling unit PHP, and the substrate platform PS17 in this order.

[Step S26] IF Block 6

The IF block 6 returns the substrate W subjected to the developing treatment to a carrier C placed on the platform 47 of the opener 45. The fourth substrate transport mechanism TM4 receives the substrate W from the substrate platform PS17, and returns the received substrate W to the carrier C placed on the platform 47 of the opener 45. Here, the substrate W is returned to the carrier C where the substrate W was accommodated prior to the coating and developing treatments. Moreover, the substrate W is returned to the carrier C placed on the platform 47 of the opener 46 with use of the fifth substrate transport mechanism TM5.

After all the treated substrates W are accommodated in the carrier C, the carrier transport mechanism 51 transports the carrier C where the treated substrates W are accommodated from the platform 47 of the opener 45 to the output port 72.

The first ID block 2, the first treating block 3, the second treating block 5, and the IF block 6 are arranged in this order as in FIG. 7. A platform 13 is placed on the first ID block 2, and the platform 47 is placed on the IF block 6. A currently-used carrier platform is provided only on the first ID block 2. Accordingly, the substrate W is transported in both the forward path and the return path between the first ID block 2 and the IF block 6. According to this embodiment, the substrate W is not transported from the IF block 6 to the first ID block 2, but the substrate W treated in the second treating block 5 is returned to the IF block 6 in the return path. Consequently, one substrate transportation process by the first treating block 3 is reduced in the return path. Reduction by one step achieves another step in the transportation process. As a result, an entire throughput of a substrate treating apparatus 1 can be enhanced.

According to this embodiment, the two treating blocks 3, 5 are disposed between the first ID block 2 and the IF block (second ID block) 6. With the substrate treating apparatus 1 having such a configuration, reduction in footprint of the substrate treating apparatus 1 is obtainable.

In this embodiment, the substrate W is taken from the carrier C on the platform 13, is subjected to a predetermined treatment in the two treating blocks 3, 5, and then is returned to the carrier C on the platform 47. In this regard, such tasks are changeable among them. That is, the substrate W may be taken from the carrier C on the platform 47, be subjected to a predetermined treatment in the two treating blocks 3, 5, and then be returned to the carrier C on the platform 13. In this case, the first treating block 3 may perform the developing process, and the second treating block 5 may perform the coating treatment. Here, the fifth substrate transport mechanism TM5 transports the substrate W directly to the heating/cooling unit PHP in the second treating block 5. In this regard, the fifth substrate transport mechanism TM5 may transport the substrate W to the substrate platform such as the substrate platform PS15, and the third substrate transport mechanism TM3 may transport the substrate W from the substrate platform to the heating/cooling unit PHP, for example.

Moreover, the platform 47 of the two openers 45, 46 is provided higher in level than the top faces of the first treating block 3 and the second treating block 5. The carrier transport mechanism 51 mounted on the first treating block 3 and the second treating block 5 achieves easy transportation of the carrier C placed on the platform 47.

THIRD EMBODIMENT

A third embodiment of the present invention will now be described with reference to the drawings. Here, the description common to that of the first and second embodiments is to be omitted.

The substrate treating apparatus 1 according to the second embodiment includes the first ID block 2, the first treating block 3, the second treating block 5, and the IF block 6. In contrast to this, a substrate treating apparatus 1 according to the third embodiment includes a first ID block 2, a first treating block 3, a second ID block 4, a second treating block 5, and an IF block 6.

Figure 12:
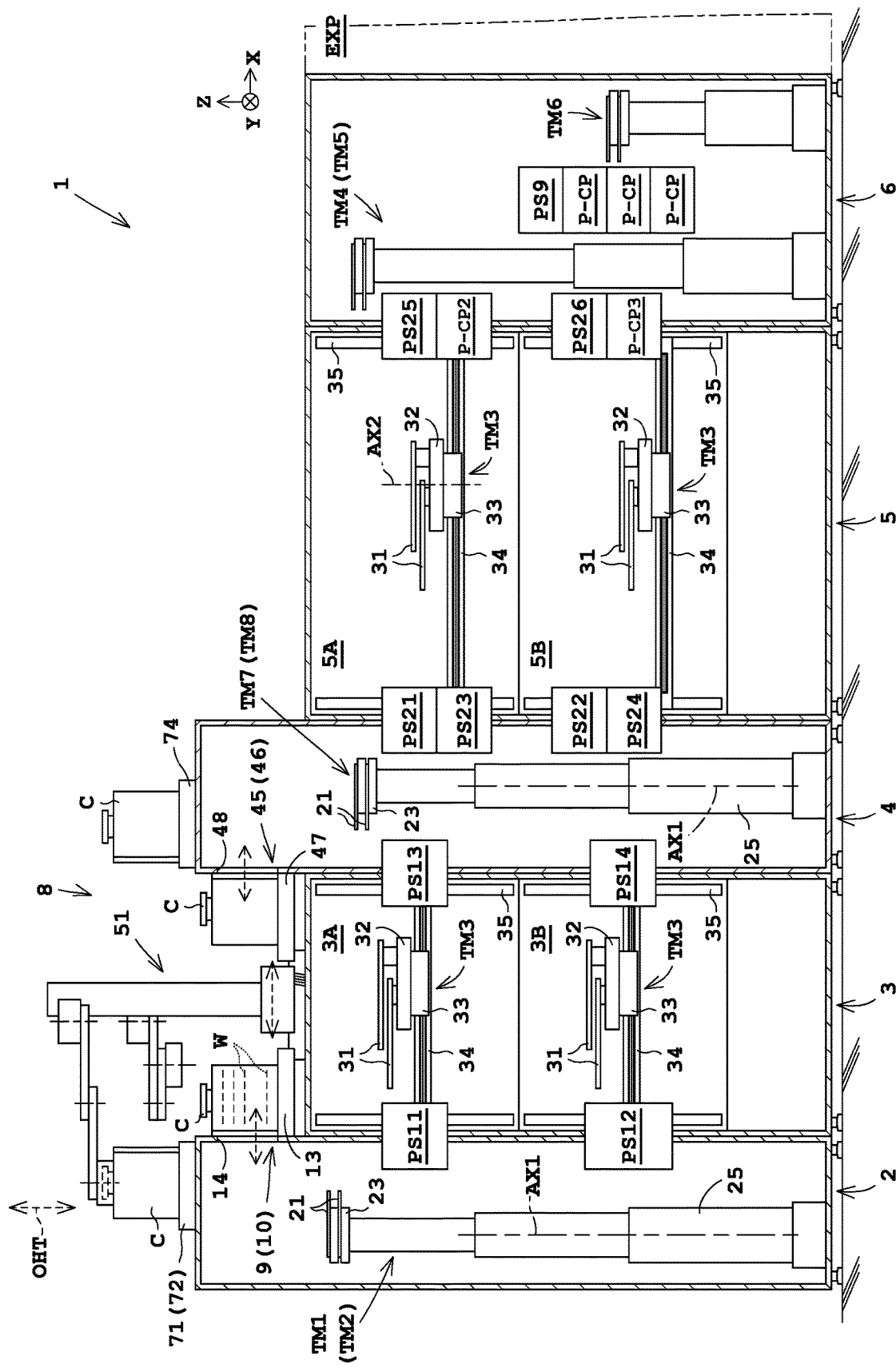
FIG. 12 is a longitudinal cross-sectional view of a substrate treating apparatus according to a third embodiment.
Figure 13:
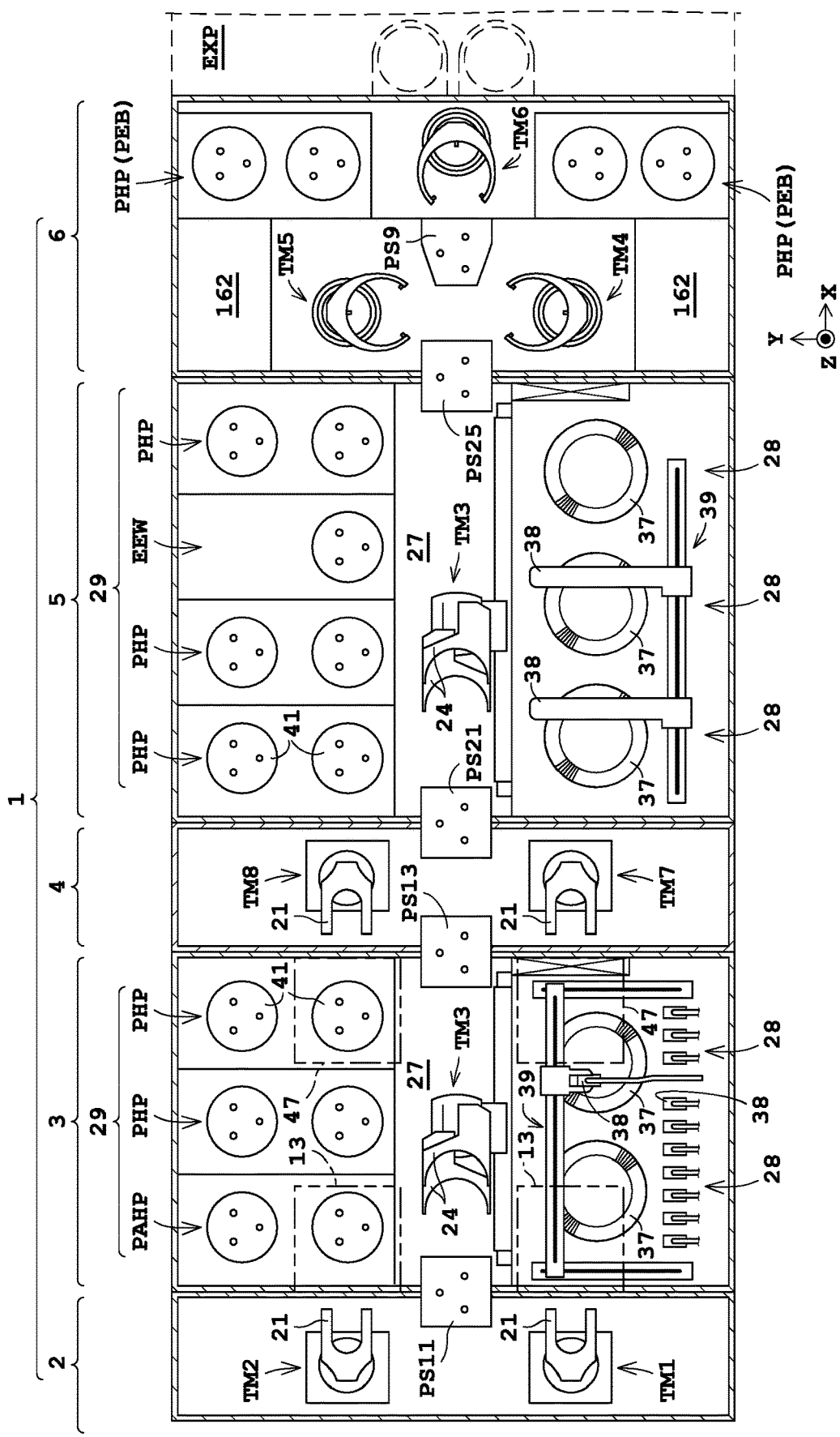
FIG. 13 is a horizontal cross-sectional view of the substrate treating apparatus according to the third embodiment.
Figure 14:
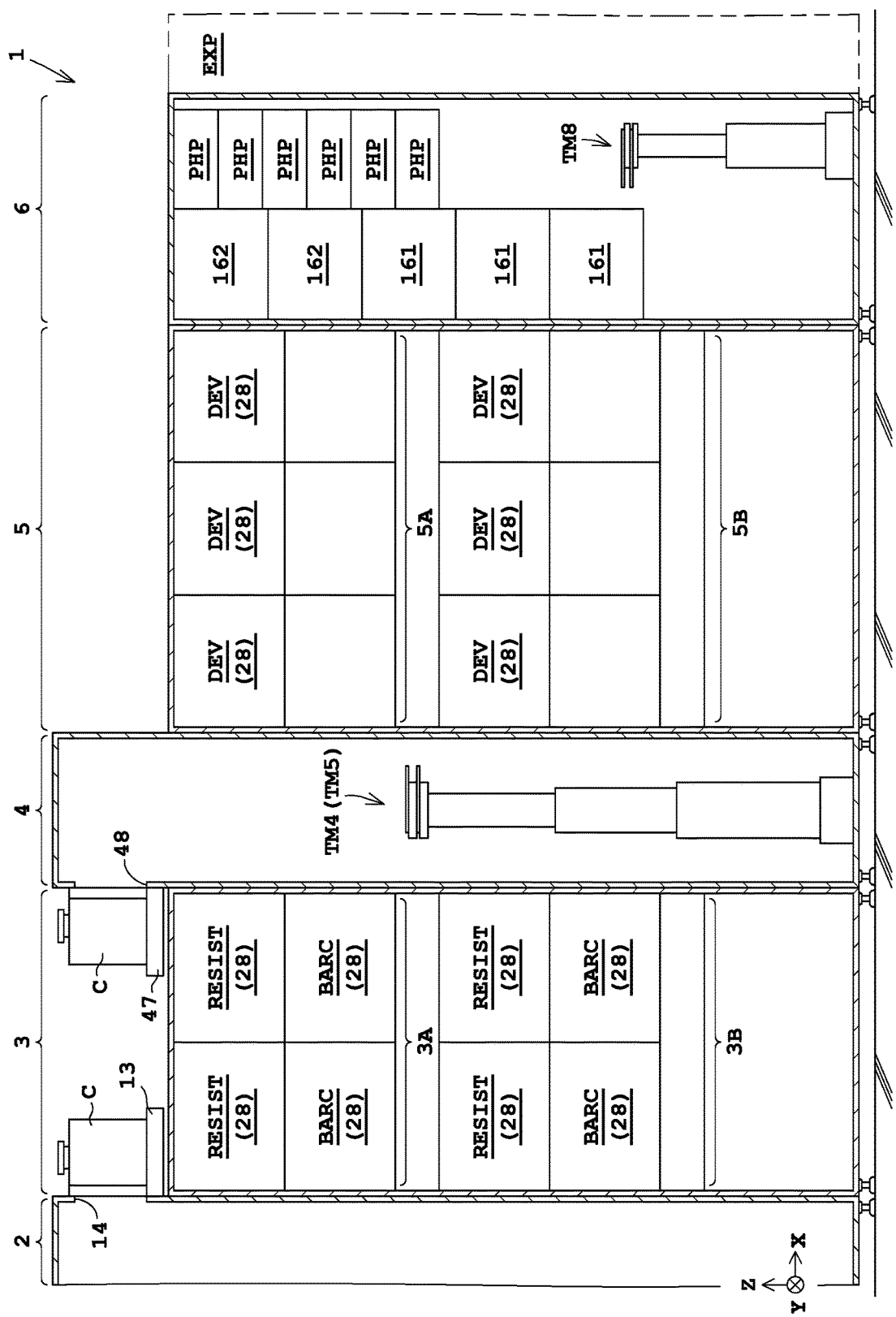
FIG. 14 is a right side view of the substrate treating apparatus according to the third embodiment.

FIG. 12 is a longitudinal cross-sectional view of the substrate treating apparatus 1 according to the third embodiment. FIG. 13 is a horizontal cross-sectional view of the substrate treating apparatus 1. FIG. 14 is a right side view of the substrate treating apparatus 1. In the substrate treating apparatus 1 according to the third embodiment, two openers 45, 46 are not disposed in the IF block 6 but in the second ID block 4.

[Configuration of Second Indexer Block 4]

As illustrated in FIGS. 12, 13, the second ID block 4 is connected to the first treating block 3, and the second treating block 5 is connected to the second ID block 4. That is, the second ID block 4 is disposed between the two treating blocks 3, 5.

The second ID block 4 includes two openers 45, 46 (see FIGS. 13, 15) and two substrate transport mechanisms TM7, TM8. The two openers 45, 46 provided in the second ID block 4 each include a carrier C placed thereon that is capable of accommodating a plurality of substrates W.

Similarly to the opener 9, the openers 45, 46 each include a platform 47 on which the carrier C is placed, an opening 48 through which the substrates W pass, a shutter member (not shown) configured to open and close the opening 48 and to attach and detach a lid to and from the carrier body, and a shutter member drive mechanism configured to drive the shutter member.

The platform 47 is provided on the roof of the first treating block 3. In FIG. 12, the platform 47 is provided higher in level than the first treating block 3, i.e., above the first treating block 3. The platform 47 may be provided on the first treating block 3, i.e., may contact the first treating block 3. The platform 47 (openers 45, 46) may be provided not above the first treating block 3 but above the second treating block 5.

The two substrate transport mechanisms TM7, TM8 are configured in the same manner as that of the first substrate transport mechanism TM1, for example. The seventh substrate transport mechanism TM7 is capable of transporting a substrate W between substrate platforms PS13, PS14, PS21 to PS24 and a carrier C on the opener 45. On the other hand, the eighth substrate transport mechanism TM8 is capable of transporting a substrate W between the substrate platforms PS13, PS14, PS21 to PS24 and a carrier C on the opener 46.

Here in FIG. 12, a substrate platform PS21 for sending and a substrate platform PS23 for return are disposed between the second ID block 4 and the upper developing-treatment layer 5A. Moreover, a substrate platform PS22 for sending and a substrate platform PS24 for return are disposed between the second ID block 4 and the lower developing-treatment layer 5B. Moreover, a substrate platform PS25 for sending and a mounting-cum-cooling unit P-CP2 for return are disposed between the upper developing-treatment layer 5A and the IF block 6. Moreover, a substrate platform PS26 for sending and a mounting-cum-cooling unit P-CP3 for return are disposed between the lower developing-treatment layer 5B and the IF block 6.

[Carrier Buffer Device 8]

Figure 15:
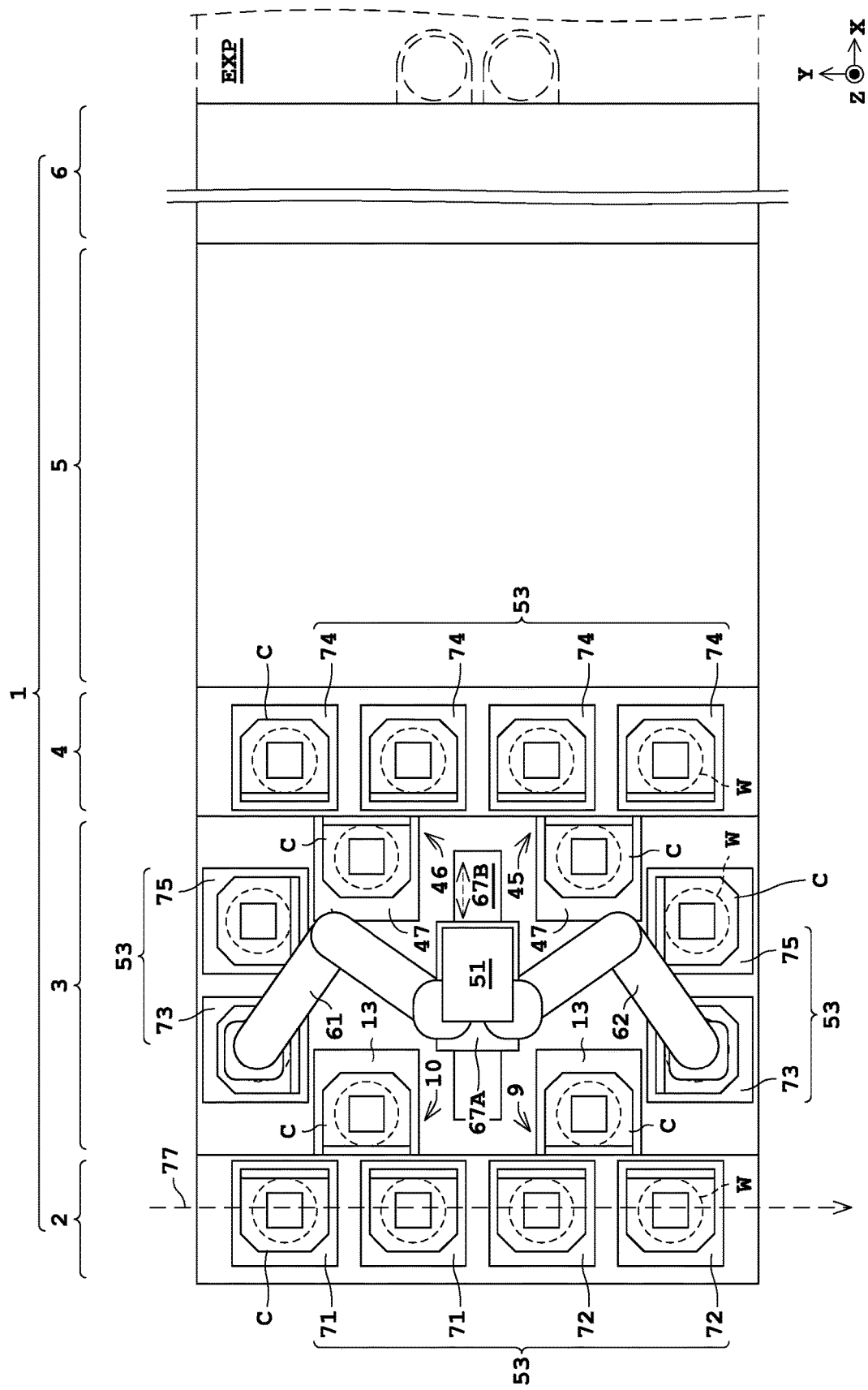
FIG. 15 is a plan view of a carrier buffer device according to the third embodiment.

The carrier buffer device 8 illustrated in FIG. 15 is mounted on the first ID block 2, the first treating block 3, and the second ID block 4. Here, the supporting portion 67A configured to support root portions of the two articulated arms 61, 62 is movable along the longitudinal portion 67B in the X-direction, but may be immovable in both the X-direction and the Y-direction.

Figure 16:
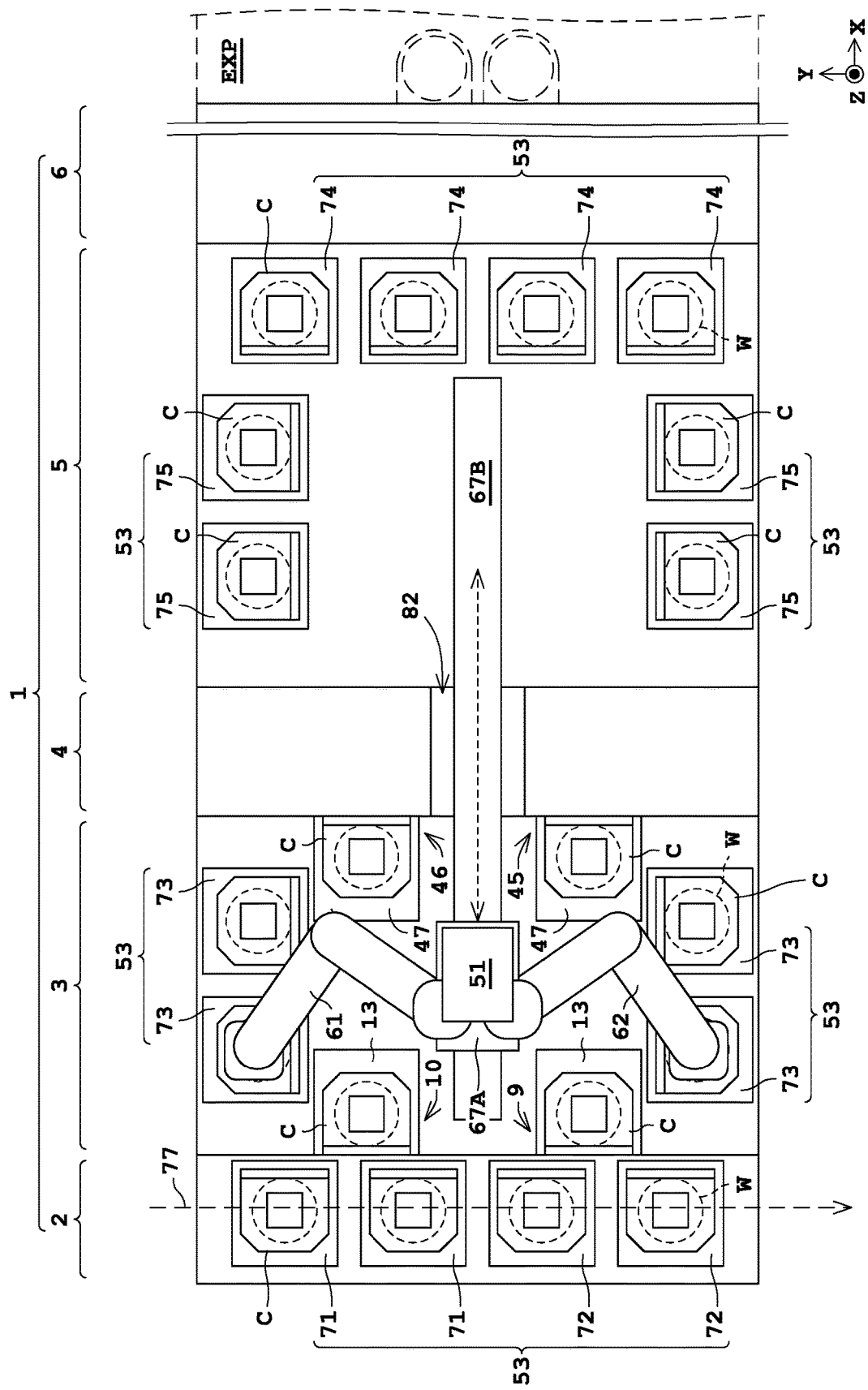
FIG. 16 is a plan view of a carrier buffer device according to one modification of the third embodiment.
Figure 17A:
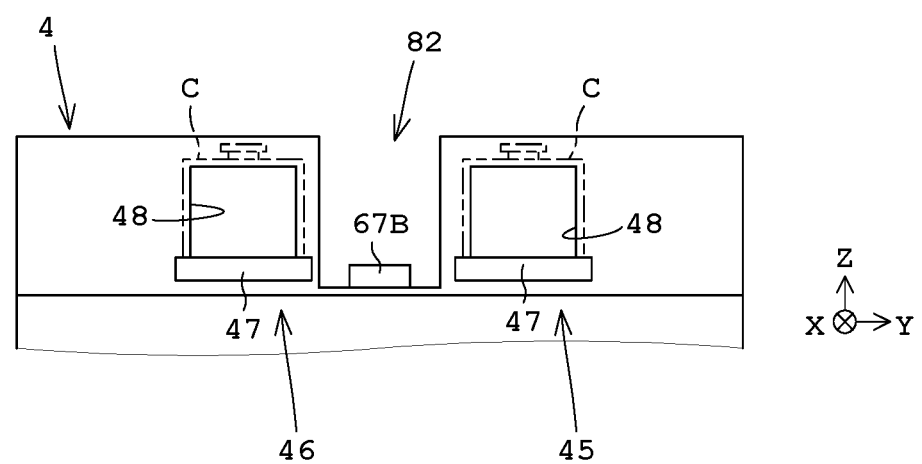
FIG. 17A is a partial front view of a groove in a second indexer block and a longitudinal portion on the groove.
Figure 17B:
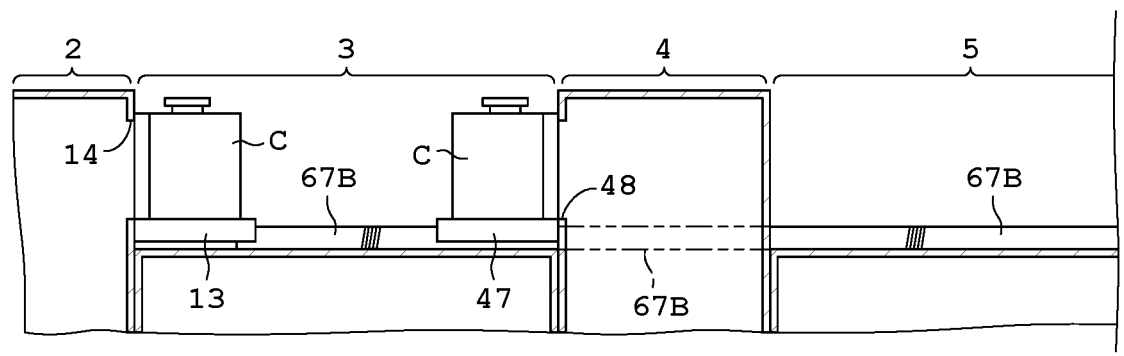
FIG. 17B is a partial right-side view of FIG. 17A.

Moreover, the carrier buffer device 8 illustrated in FIG. 16 is mounted on the two ID blocks 2, 4 and the two treating blocks 3, 5. Here, the carrier buffer device 8 may be mounted also on the IF block 6. Moreover, the longitudinal portion 67B of the carrier transport mechanism 51 is mounted on two treating blocks 3, 5 and the second ID block 4. As illustrated in FIGS. 17A, 17B, the longitudinal portion 67B is mounted on a groove 82 formed in the second ID block 4.

The longitudinal portion 67B is mounted on the groove 82 formed in the second ID block 4. This achieves a lowered level of the carrier transport mechanism 51. This also achieves usage of an area opposite to the first ID block 2 across the second ID block 4 as the carrier storage shelves 53.

<Operation of Substrate Treating Apparatus 1>

An operation of the substrate treating apparatus 1 will now be described. Reference is made to FIGS. 12 and 14. The carrier transport mechanism 51 transports a carrier C from the input port 71 to the platform 13 of the opener 9, for example.

[Step S31] First ID Block 2

The first substrate transport mechanism TM1 of the first ID block 2 takes a substrate W from the carrier C placed on the platform 13 of the opener 9, and transports the taken substrate W to the first treating block 3, for example. That is, the taken substrate W is transported to one of the two substrate platforms PS11, PS12.

Here, when all the substrates W are taken from the carrier C, the carrier transport mechanism 51 transports the empty carrier C to the platform 47 of the opener 45, for example.

[Step S32] First Treating Block 3

The first treating block 3 performs a coating treatment on the substrate W sent from the first ID block 2, and sends the substrate W subjected to the coating treatment to the second ID block 4. For instance, the third substrate transport mechanism TM3 in the upper coating-treatment layer 3A receives the substrate W from the substrate platform PS11, and transports the received substrate W to the coating unit BARC and the coating unit RESIST, for example. The third substrate transport mechanism TM3 transports the substrate W, subjected to the coating treatment, to the substrate platform PS13.

[Step S33] Second ID Block 4

The second ID block 4 sends the substrate W, sent from the first treating block 3, to the second treating block 5. Specifically, one of the two substrate transport mechanisms TM7, TM8 of the second ID block 2 receives the substrate W from the substrate platform PS13, and transports the received substrate W to the substrate platform PS21, for example. It should be noted that transportation of the received substrate W to the substrate platform PS22 (the lower developing-treatment layer 5B) is performable.

[Step S34] Second Treating Block 5

The second treating block 5 does not perform any developing treatment on the substrate W subjected to the coating treatment, but sends the substrate W, sent from the second ID block 4, to the IF block 6 Specifically, the third substrate transport mechanism TM3 in the upper developing-treatment layer 5A receives the substrate W from the substrate platform PS21, and transports the received substrate W to the substrate platform PS25.

[Step S35] IF Block 6

The IF block 6 unloads the substrate W sent from the second treating block 5 into the exposure device EXP. Thereafter, the IF block 6 loads the substrate W subjected to the exposure treatment from the exposure device EXP, and sends the substrate W subjected to the exposure treatment to the second treating block 5. That is, the substrate W subjected to the exposure treatment is sent to the mounting-cum-cooling unit P-CP2, for example.

[Step S36] Second Treating Block 5

The second treating block 5 performs the developing treatment on the substrate W subjected to the exposure treatment, and sends the substrate W subjected to the developing treatment to the second ID block 4. For instance, the third substrate transport mechanism TM3 in the developing-treatment layer 5A receives the substrate W from the mounting-cum-cooling unit P-CP2, transports the received substrate W to the developing unit DEV, for example, and thereafter, transports the substrate W to the substrate platform PS23.

[Step S37] Second ID Block 4

The second ID block 4 returns the substrate W subjected to the developing treatment to a carrier C placed on the platform 47 of the opener 45, for example. For instance, the seventh substrate transport mechanism TM7 transports the substrate W from the substrate platform PS23 to the carrier C on the opener 45.

According to this embodiment, the second ID block 4 is disposed between the two treating blocks 3, 5. With the substrate treating apparatus 1 having such a configuration, reduction in footprint of the substrate treating apparatus 1 is obtainable.

FOURTH EMBODIMENT

A fourth embodiment of the present invention will now be described with reference to the drawings. Here, the description common to that of the first to third embodiments is to be omitted.

The substrate treating apparatus 1 according to the first embodiment includes the first ID block 2 and the first treating block 3. In contrast to this, the substrate treating apparatus 1 according to the fourth embodiment includes a first ID block 2, a first treating block 3, and a second ID block 4.

Figure 18:
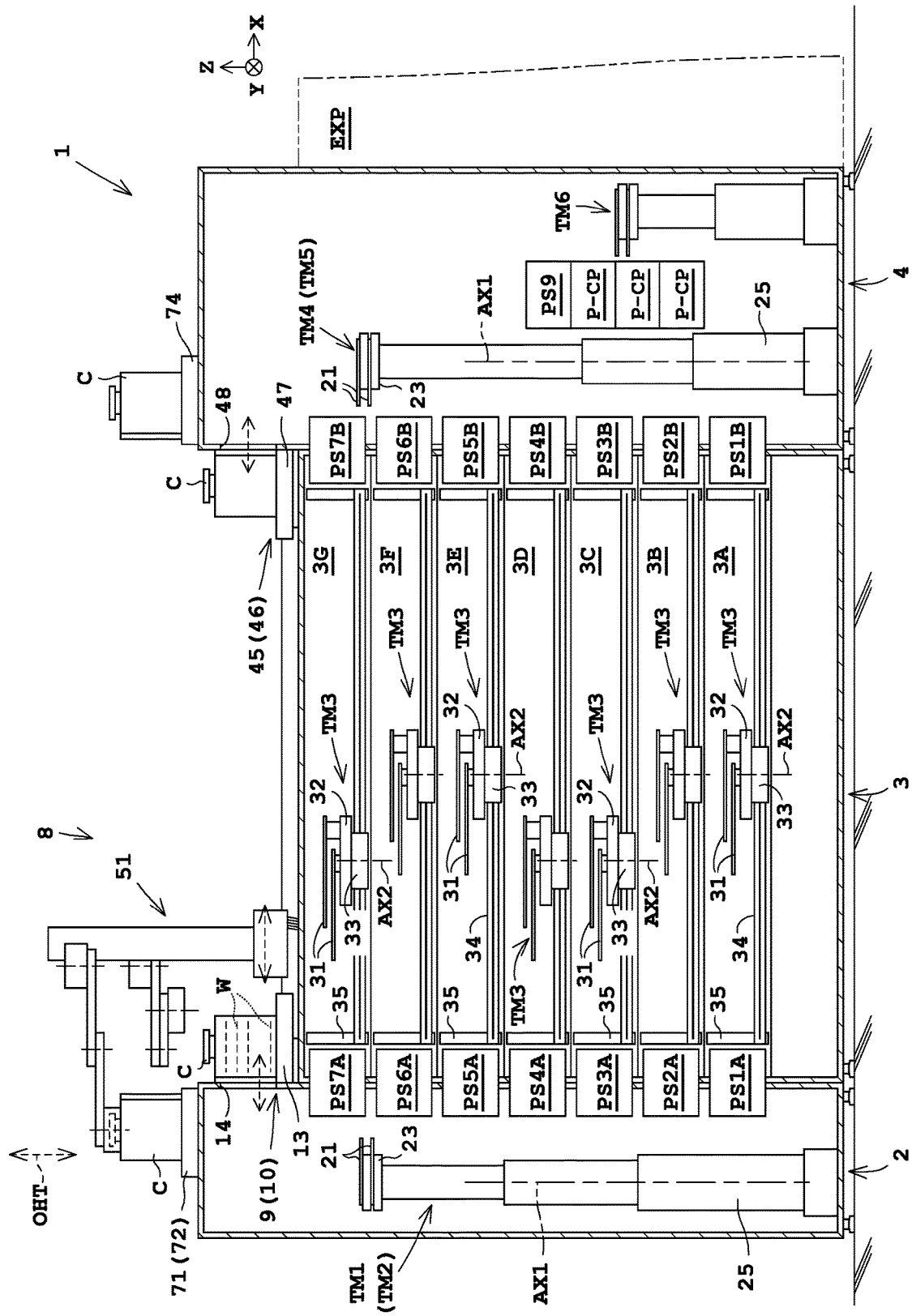
FIG. 18 is a longitudinal cross-sectional view of a substrate treating apparatus according to a fourth embodiment.
Figure 19:
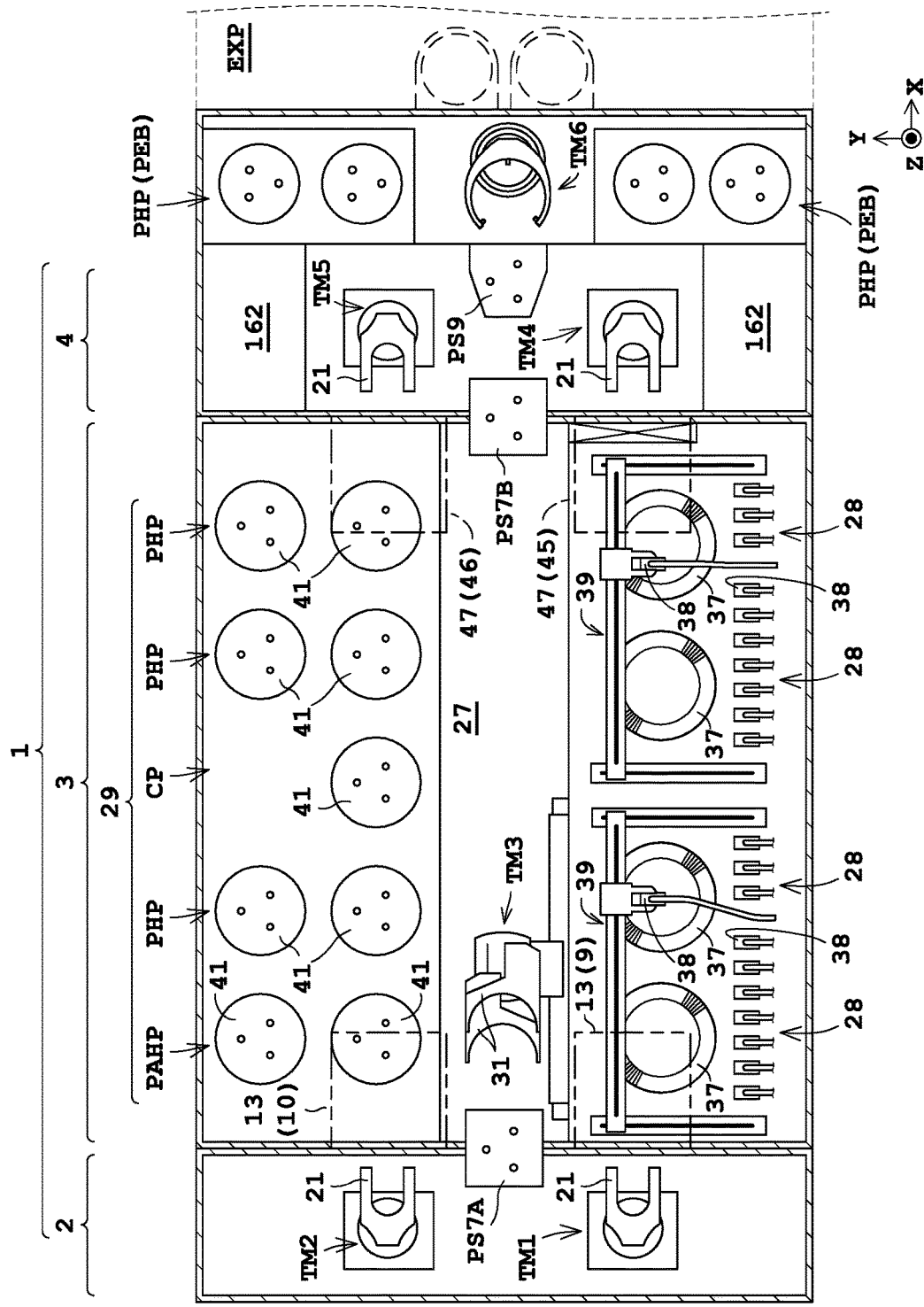
FIG. 19 is a horizontal cross-sectional view of the substrate treating apparatus according to the fourth embodiment.
Figure 20:
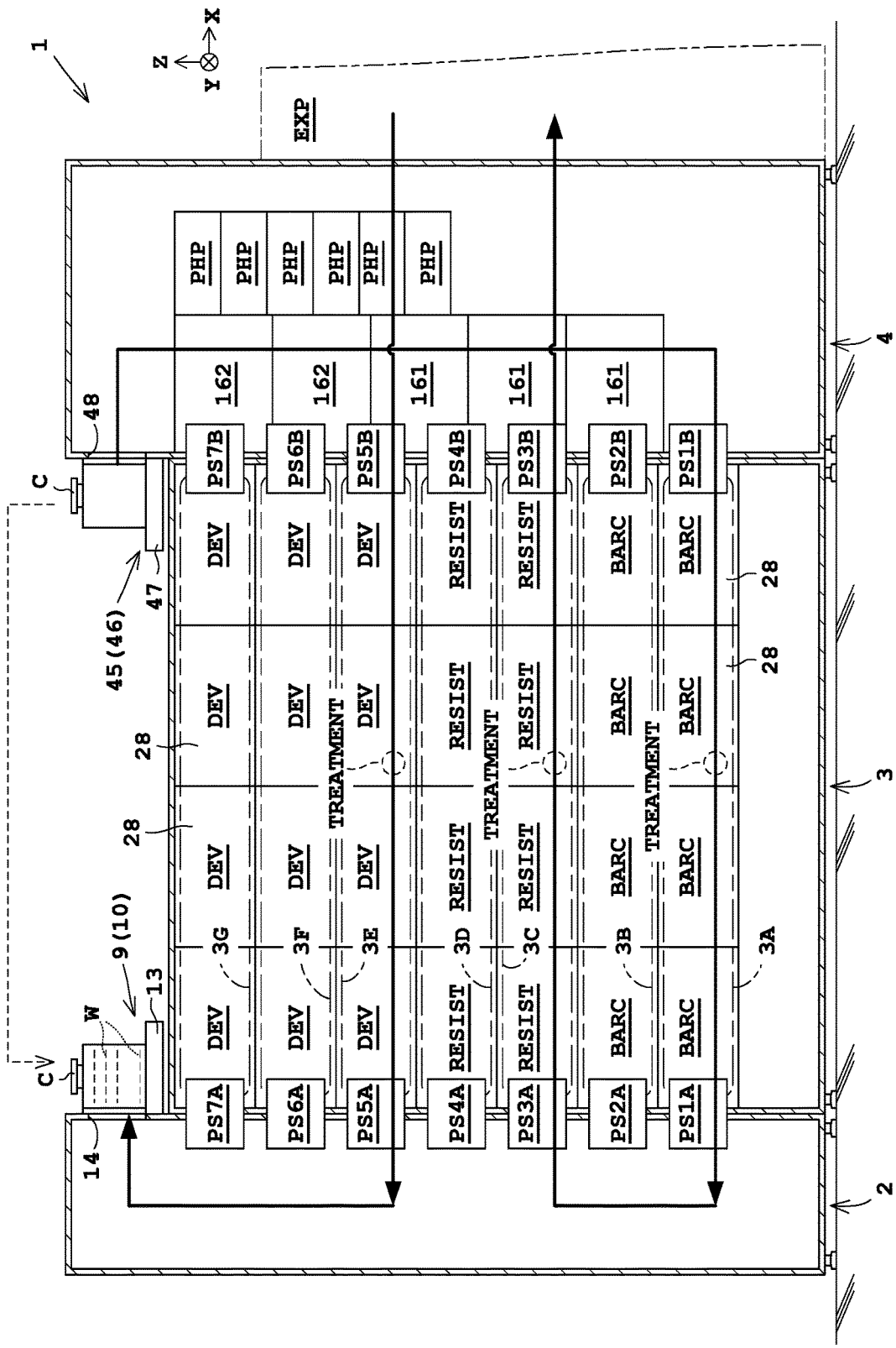
FIG. 20 is a right side view of the substrate treating apparatus according to the fourth embodiment.

FIG. 18 is a longitudinal cross-sectional view of a substrate treating apparatus 1 according to the fourth embodiment. FIG. 19 is a horizontal cross-sectional view of the substrate treating apparatus 1. FIG. 20 is a right side view of the substrate treating apparatus 1.

Reference is made to FIGS. 18 and 19. The substrate treating apparatus 1 according to the fourth embodiment includes a single treating block (first treating block) 3. The single treating block 3 includes one or two or more treatment layers. In FIG. 18, the single treating block 3 includes seven treatment layers 3A to 3G arranged in the upward/downward direction. Here, seven substrate platforms PS1A to PS7A are disposed between the first ID block 2 and the seven treatment layers 3A to 3G. Moreover, seven substrate platforms PS1B to PS7B are disposed between the seven treatment layers 3A to 3G and the second ID block 4.

As illustrated in FIG. 20, the two lower treatment layers 3A, 3B each include coating units BARC configured to form an antireflection film on a substrate W. The two middle treatment layers 3C, 3D each include coating units RESIST configured to form a resist film on a substrate W. Moreover, the three upper treatment layers 3E to 3G each include a developing unit DEV configured to develop the exposed substrate W.

[Carrier Buffer Device 8]

Figure 21:
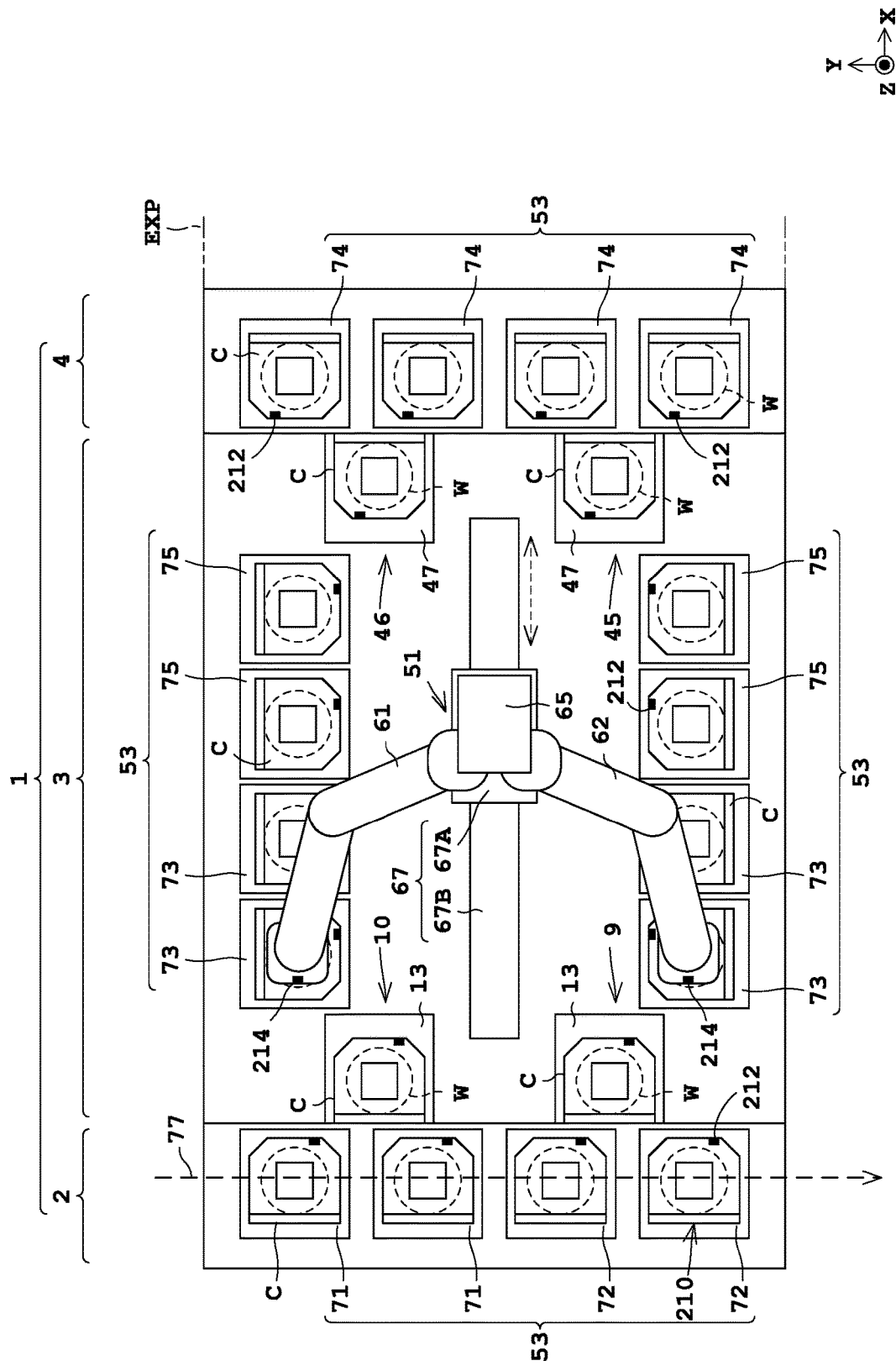
FIG. 21 is a plan view of a carrier buffer device according to the fourth embodiment.

As illustrated in FIG. 21, the carrier buffer device 8 according to this embodiment is mounted on the first ID block 2, the treating block 3, and the second ID block (IF block) 4. In FIG. 21, the input port 71 and the output port 72 are arranged along the rail 77 of the external transport mechanism OHT in the Y-direction. The empty carrier shelves 74 are disposed on the second ID block 4 in such a manner as to be arranged in line in the Y-direction. The longitudinal portion 67B of the carrier transport mechanism 51 extends in the X-direction between the first ID block 2 and the second ID block 4. The untreated substrate carrier shelves 73, and the treated substrate carrier shelves 75 are arranged along the longitudinal portion 67B.

<Operation of Substrate Treating Apparatus 1>

An operation of the substrate treating apparatus 1 according to this embodiment will now be described. Reference is made to FIG. 20.

[Step S41] Second ID Block 4 (IF Block)

The second ID block 4 takes a substrate W from a carrier C placed on the platform 47 of one of the two openers 45, 46, and transports the taken substrate W to one of the two treatment layers 3A, 3B. Detailed description is as under. For instance, the fourth substrate transport mechanism TM4 of the second ID block 4 takes a substrate W from the carrier C placed on the platform 47 of the opener 45, and transports the taken substrate W to the substrate platform PS1B.

Here, when all the substrates W are taken from the carrier C, the carrier transport mechanism 51 transports the empty carrier C to the platform 13 of the opener 9, for example.

[Step S42] Treatment Layers 3A, 3B in Treating Block 3 (First Coating Treatment)

The treatment layers 3A, 3B each perform the first coating treatment (e.g., antireflection film formation) on the transported substrate W and transports the substrate W subjected to the first coating treatment to the first ID block 2. For instance, in the treatment layer 3A of the treating block 3, the third substrate transport mechanism TM3 in FIGS. 18, 19 receives a substrate W from the substrate platform PS1B, and transports the received substrate W to at least the coating unit BARC. Thereafter, the third substrate transport mechanism TM3 transports the substrate W on which the antireflection film is formed in the coating unit BARC to the substrate platform PS1A.

[Step S43] First ID Block 2

The first ID block 2 transports the transported substrate W, subjected to the first coating treatment, to the treatment layer 3C. That is, one of the two substrate transport mechanisms TM1, TM2 transports the substrate W from the substrate platform PS1A to the substrate platform PS3A in FIG. 20. Here, the substrate W subjected to the first coating treatment in the treatment layer 3B is sent to the treatment layer 3D.

[Step S44] Treatment Layers 3C, 3D in Treating Block 3 (Second Coating Treatment)

The treatment layers 3C, 3D each perform the second coating treatment (e.g., resist film formation) on the transported substrate W and transports the substrate W subjected to the second coating treatment to the second ID block 4. For instance, in the treatment layer 3C of the treating block 3, the third substrate transport mechanism TM3 in FIGS. 18, 19 receives a substrate W from the substrate platform PS3A. The third substrate transport mechanism TM3 transports the received substrate W to at least a coating unit RESIST. The third substrate transport mechanism TM3 transports the substrate W on which a resist film is formed by the coating unit RESIST to the substrate platform PS3B.

[Step S45] Second ID Block 4 (Exposure Treatment by Exposure Device)

The second ID block 4 unloads the substrate W treated in the treatment layer 3C into the exposure device EXP. Moreover, the second ID block 4 loads the substrate W, subjected to the exposure treatment by the exposure device EXP, from the exposure device EXP. The second ID block 4 transports the loaded substrate W to any of the three treatment layers 3E to 3G. For instance, an exposure treatment is performed, and thereafter the substrate W treated in the post-exposure cleaning unit 162 and the heating/cooling unit PHP of the second ID block 4 is transported to the substrate platform PS5B.

[Step S46] Treatment Layers 3E to 3G in Treating Block 3 (Developing Treatment)

Each of the three treatment layers 3E to 3G in the treating block 3 performs the developing treatment on the transported substrate W and transports the substrate W subjected to the developing treatment to the first ID block 2. For instance, in the treatment layer 3E, the third substrate transport mechanism TM3 receives the substrate W from the substrate platform PS5B, and transports the substrate W to at least the developing unit DEV, and thereafter transports the substrate W subjected to the developing treatment to the substrate platform PS5A.

[Step S47] First ID Block 2

The first ID block 2 returns the substrate W, developed in any of the treatment layers 3E to 3G, to a carrier C placed on the platform 13 of any of the two openers 9, 10. Detailed description is as under. One of the two substrate transport mechanism TM1, TM2 receives the substrate W from the substrate platform PS5A, and returns the received substrate W to the carrier C placed on the platform 13 of the opener 9.

This embodiment achieves reduction in footprint of the substrate treating apparatus 1 in which the single treating block 3 is sandwiched with the first ID block 2 and the ID block (IF block) 4.

This invention is not limited to the foregoing examples, but may be modified as follows.

(1) In the first embodiment, the substrate treating apparatus 1 includes one treating block 3, but may include a plurality of treating blocks 3 arranged in line in the horizontal direction. In this case, the longitudinal portion 67B of the carrier transport mechanism 51 may be placed so as to extend from one treating block on the first end to one treating block of the second end in the treating blocks 3.

(2) In the first embodiment and the modification (1) described above, the treating block 3 performs the coating treatment. In this regard, the treating block 3 may perform the developing treatment. Alternatively, the treating block 3 may perform the cleaning treatment. The cleaning unit configured to perform the cleaning treatment (liquid treatment unit SC) includes a holding rotation portion, a liquid supplying portion, and a brush cleaning mechanism, for example. The holding rotation portion holds by contacting an end of the substrate W at three or more points, and rotates the held substrate W. The liquid supplying portion includes a nozzle, and a supplying pipe in communication with the nozzle. The liquid supplying portion supplies a treating liquid to the substrate W held by the holding rotation portion. The brush cleaning mechanism includes a brush cleaner, and a support arm configured to support the brush cleaner in a rotatable manner.

Moreover, the following is usable as the treating liquid for cleaning: an ammonia hydrogen peroxide mixed solution (APM), deionized water (DIW), carbonated water, hydrogenated water, ammonia water ($NH_4OH$), SC1, SC2, a citric acid solution, a mixed chemical of hydrofluoric acid and ozone (FOM), a mixed chemical of hydrofluoric acid, hydrogen peroxide solution and deionized water (FPM), hydrofluoric acid (HF), HCl, isopropyl alcohol (IPA), tetramethylammonium hydroxide (TMAH), trimethyl-2-hydroxyethyl ammonium hydroxide solution (CHOLINE).

Figure 22:
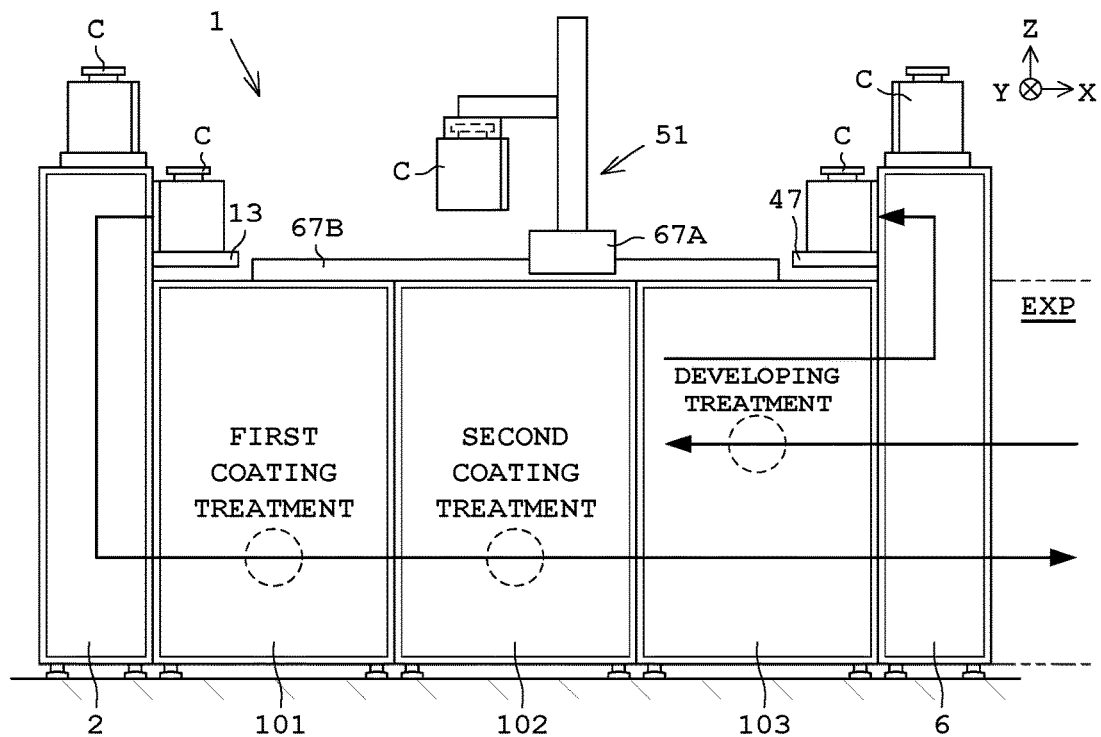
FIG. 22 illustrates a configuration and operation of a substrate treating apparatus according to one modification.

(3) In the second embodiment and the modifications, the substrate treating apparatus 1 includes the two treating blocks 3, 5. In this regard, the substrate treating apparatus 1 may include three or more treating blocks. In FIG. 22, the substrate treating apparatus 1 includes three treating blocks 101 to 103. The treating block 101 on the first end performs a first coating treatment to form an antireflection film on the substrate W, for example. The treating block 102 on the middle performs a second coating treatment to form a resist film on the substrate W. The treating block 103 on the second end performs the developing treatment on the substrate W. The three treating blocks 101 to 103 illustrated in FIG. 22 each include a single treatment layer, but may include two or more treatment layers.

The IF block (second ID block) 6 is connected to the treating block 103 of the three treating blocks 101 to 103 on the second end. The carrier buffer device 8 may be arranged so as to extend from the first ID block 2 to the IF block 6.

One example operation of the substrate treating apparatus 1 will now be described. The first ID block 2 takes a substrate W from a carrier C on the platform 13. In this case, the taken substrate W is transported to the first treating block 101 (first coating treatment), the second treating block 102 (second coating treatment), the third treating block 103 (pass through portion), the IF block 6, the exposure device EXP, the IF block 6, the third treating block 103 (developing treatment), and the IF block 6 in this order. Then, the IF block 6 accommodates the developed substrate W into the carrier C on the platform 47.

Figure 23:
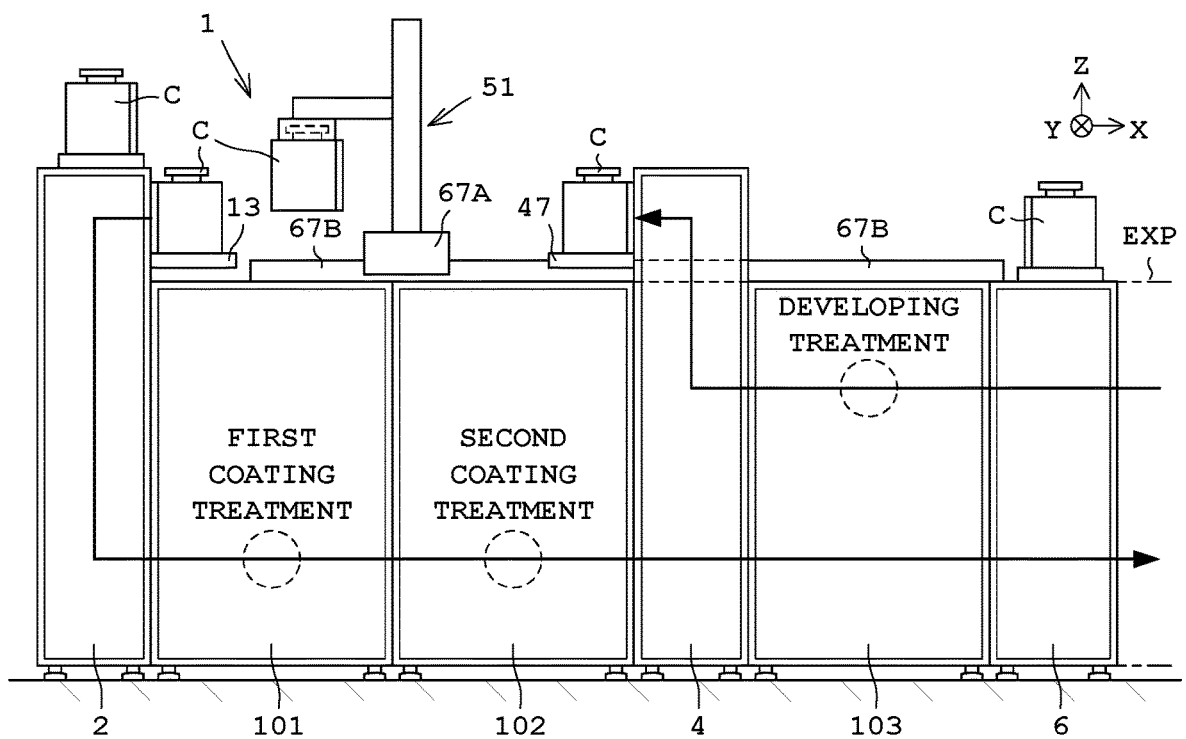
FIG. 23 illustrates a configuration and operation of a substrate treating apparatus according to one modification.

(4) In the third embodiment and the modifications, the substrate treating apparatus 1 includes the two treating blocks 3, 5. In this regard, the substrate treating apparatus 1 may include three or more treating blocks. In FIG. 23, the substrate treating apparatus 1 includes three treating blocks 101 to 103. The second ID block 4 is disposed between the two treating blocks 102, 103, for example. At least one treating block may be disposed between the first ID block 2 and the second ID block 4. In addition, at least one treating block may be disposed between the second ID block 4 and the IF block 6.

One example operation of the substrate treating apparatus 1 will now be described. The first ID block 2 takes a substrate W from a carrier C on the platform 13. In this case, the taken substrate W is transported to the first treating block 101 (first coating treatment), the second treating block 102 (second coating treatment), the second ID block 4, the third treating block 103 (pass through portion), the IF block 6, the exposure device EXP, the IF block 6, the third treating block 103 (developing treatment), and the second ID block 4 in this order. Then, the second ID block 4 accommodates the developed substrate W into the carrier C on the platform 47.

(5) In the second to fourth embodiments and the modifications, the substrate treating apparatus 1 is connected to the exposure device EXP. In this regard, the substrate treating apparatus 1 is not necessarily connected to the exposure device EXP. In this case, in FIG. 8, for example, the configuration may be adopted where the first treating block 3 performs the first coating treatment to form an antireflection film and the second treating block 5 performs the second coating treatment to form the resist film. Here, the first coating treatment may be treatment of forming an antireflection film and a resist film, and the second coating treatment may be treatment of forming a resist cover film.

(6) Here, in the substrate treating apparatus 1 in the second and third embodiments described above, the two openers 9, 10 are used for taking substrates W and the two openers 45, 46 are used for accommodating substrates W. Such tasks are replaceable. In other words, the two openers 45, 46 may be used for taking substrates W and the two openers 9, 10 may be used for accommodating substrates W.

Moreover, in the fourth embodiment, the two openers 45, 46 are used for taking substrates W and the two openers 9, 10 are used for accommodating substrates W. Such tasks are replaceable. In other words, the two openers 9, 10 may be used for taking substrates W and the two openers 45, 46 may be used for accommodating substrates W.

Figure 24:
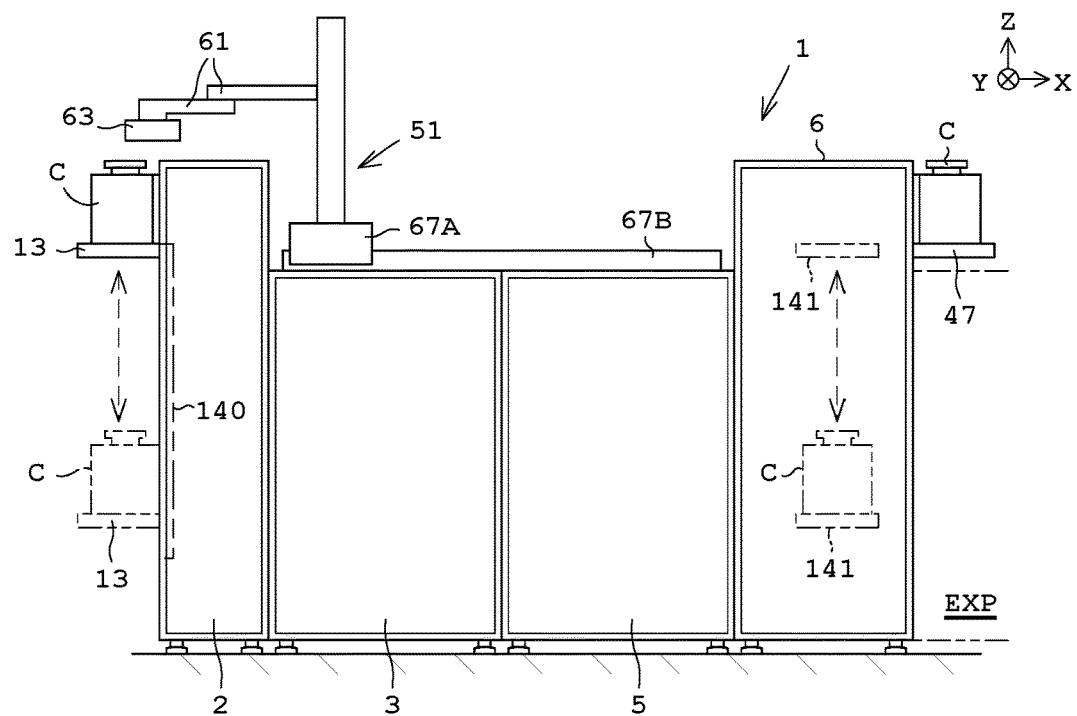
FIG. 24 illustrates arrangement of an opener (platform) according to one modification.

(7) In the embodiments and the modifications described above, the opener 9 (platform 13) is disposed toward the treating block 3 and the opener 45 (platform 47) is disposed toward the treating block 3, for example, in FIG. 7. This makes it easy for the carrier transport mechanism 51 to transport the carrier C to the platforms 13, 47. As illustrated in FIG. 24, the opener 9 may be disposed on an outer wall of the first ID block 2 opposite to the first treating block 3 across the first ID block 2 as necessary. Moreover, the opener 45 may be disposed on an outer wall of the IF block 6 adjacent to the exposure device EXP.

Moreover, at least one of the platforms 13 illustrated in FIG. 24 may be movable upwardly/downwardly. The substrate treating apparatus 1 includes a lifting/lowering mechanism 140 that is interposed between the first ID block 2 and the platform 13 and causes the platform 13 to be movable upwardly/downwardly between the top face side and the floor side of the first ID block 2. The lifting/lowering mechanism 140 includes an electric motor. The lifting/lowering mechanism 140 causes the platform 13 to move upwardly/downwardly, whereby the platform 13 is movable downwardly to a level where an operator is able to place the carrier C directly on the platform 13. For instance, when the substrate treating apparatus 1 is used in nonproductive time such as evaluation or maintenance, not the external transport mechanism OHT but the operator often performs hand transportation. In such a case, the operator is able to place the carrier on the platform 13 directly. Thus, the substrate treating apparatus is usable flexibly in the evaluation or the maintenance, leading to an enhanced work efficiency.

Moreover, when the exposure device EXP is not connected to the IF block 6 (or the second ID block 4), for example, the platform 47 may be configured to be movable upwardly/downwardly. For instance, a platform 141 other than the platforms 13, 47 may be configured to be movable upwardly/downwardly on a side face of the IF block 6 by the lifting/lowering mechanism. In this case, when the platform 141 is moved upwardly to a level substantially equal to the platform 47, the carrier transport mechanism 51 transports a carrier C from the platform 141 to the platform 47, for example.

Figure 25A:
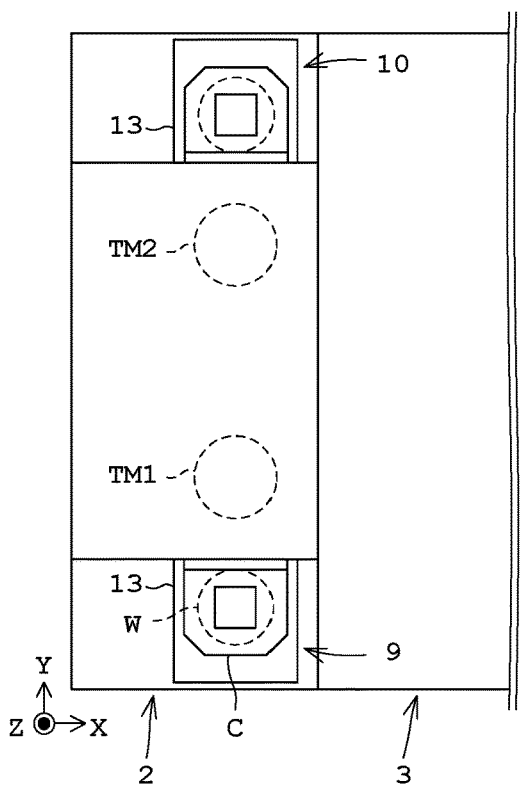
FIG. 25A illustrates arrangement of an opener (platform) according to another modification.
Figure 25B:
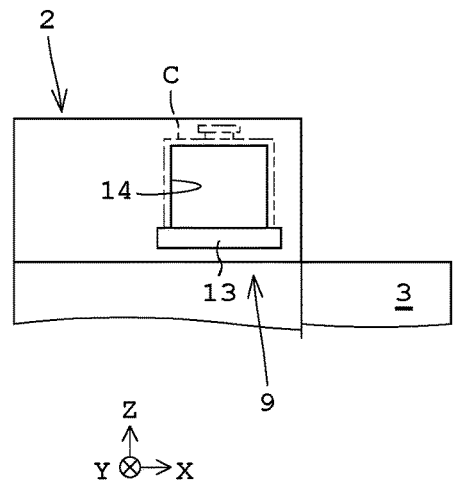
FIG. 25B is a partial right-side view of FIG. 25A.

(8) In the embodiments and the modifications described above, the platform 13 (openers 9, 10) is disposed in such a manner so as to be housed in an area of at least either the first ID block 2 or the first treating block 3 in plan view. For instance, the platform 13 (openers 9, 10) may be disposed in such a manner so as to be housed in an area of the first ID block 2 in plan view, as illustrated in FIGS. 25A, 25B.

Figure 26A:
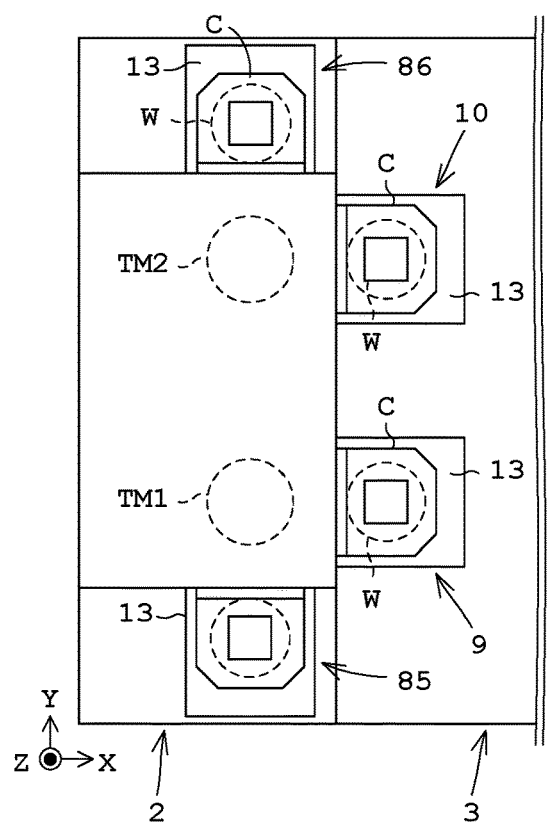
FIG. 26A illustrates arrangement of an opener (platform) according to another modification.
Figure 26B:
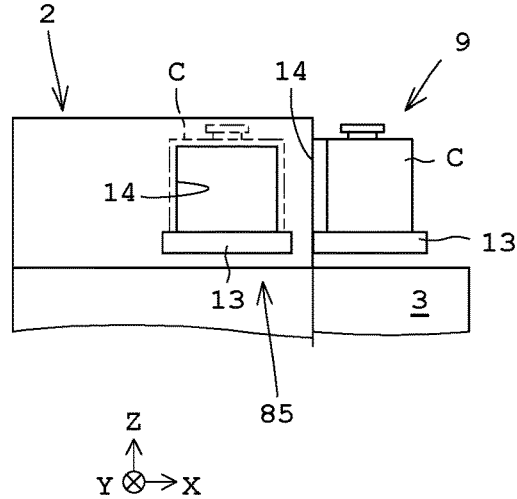
FIG. 26B is a partial right-side view of FIG. 26A.

Moreover, the platform 13 (openers 9, 10) may be disposed in such a manner so as to be housed in an area of the first ID block 2 and the first treating block 3 in plan view, as illustrated in FIGS. 26A, 26B. The two openers 9, 85 (two platforms 13) are disposed around the first substrate transport mechanism TM1 in plan view in FIG. 26A. Moreover, the two openers 10, 86 (two platforms 13) are disposed around the second substrate transport mechanism TM2. The first substrate transport mechanism TM1 is configured to take a substrate W from each of the carriers C on the two openers 9, 85. Moreover, the second substrate transport mechanism TM2 is configured to take a substrate W from each of the carriers C on the two openers 10, 86.

That is, the platforms 13 of the four openers 9, 10, 85, 86 are disposed in such a manner so as to be housed in an area of at least either the first ID block 2 or the first treating block 3 in plan view. Accordingly, the platform 13 is capable of facing the carrier transport mechanism 51, whereby the carrier transport mechanism 51 can transport the carrier C placed on the platform 13 relatively easily.

(9) In the second to fourth embodiments described above, the fourth substrate transport mechanism TM4 of the IF block 6 transports a substrate W among the five substrate platforms PS15 to PS18, PS9, the five mounting-cum-cooling units P-CP, P-CP2, P-CP3, the pre-exposure cleaning unit 161, and the carrier C placed on the opener 45, as illustrated in FIGS. 7 to 10, for example. Moreover, the fifth substrate transport mechanism TM5 transports a substrate W among the five substrate platforms PS15 to PS18, PS9, the five mounting-cum-cooling units P-CP, P-CP2, P-CP3, the post-exposure cleaning unit 162, and the carrier C placed on the opener 46.

For instance, the fifth substrate transport mechanism TM5 may transport a substrate W among the three substrate platforms PS15, PS16, PS9, the five mounting-cum-cooling units P-CP, P-CP2, P-CP3, the post-exposure cleaning unit 162, and the carrier C placed on the opener 46. In this case, the fourth substrate transport mechanism TM4 may transport a substrate W among the two substrate platforms PS17, PS18, the post-exposure cleaning unit 161, and the carrier C on the opener 45. Such task is replaceable between the fourth substrate transport mechanism TM4 and the fifth substrate transport mechanism TM5.

Figure 27:
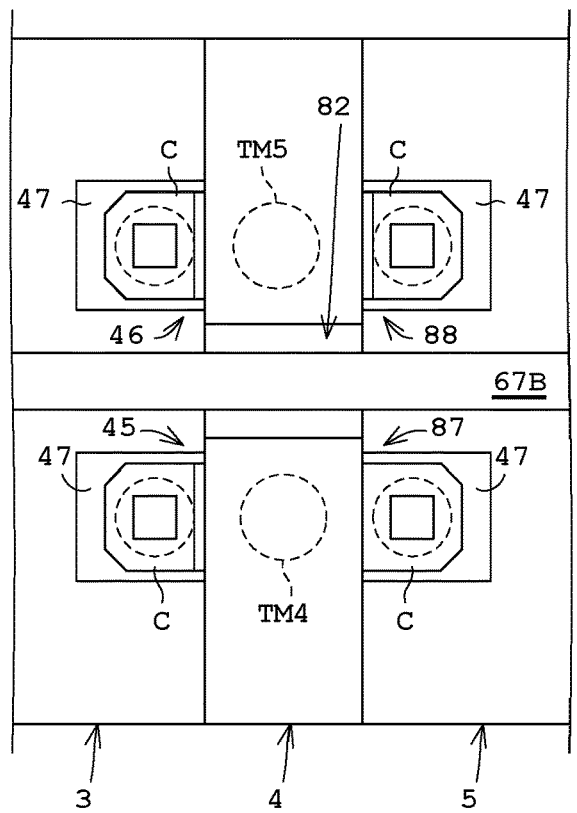
FIG. 27 illustrates arrangement of an opener (platform) according to still another modification.

For instance, the opener 46 is not necessarily provided if the fourth substrate transport mechanism TM4 transports a substrate W to the carrier C on the opener 45. For instance, if the fourth substrate transport mechanism TM4 transports the substrate W to carriers C on a plurality of (e.g., two) openers 45, 87, the two openers 45, 87 (two platforms 47) are disposed around the fourth substrate transport mechanism TM4 in plan view, as illustrated in FIG. 27.

That is, the second ID block 4 includes the fourth substrate transport mechanism TM4 configured to transport the substrate W, for example. The platforms 47 of the two openers 45, 87 are disposed around the fourth substrate transport mechanism TM4 in plan view. One fourth substrate transport mechanism TM4, for example, is capable of transporting carriers C to a plurality of the platforms 47. It should be noted that the same is applicable to the openers 46, 88 illustrated in FIG. 27.

Figure 28:
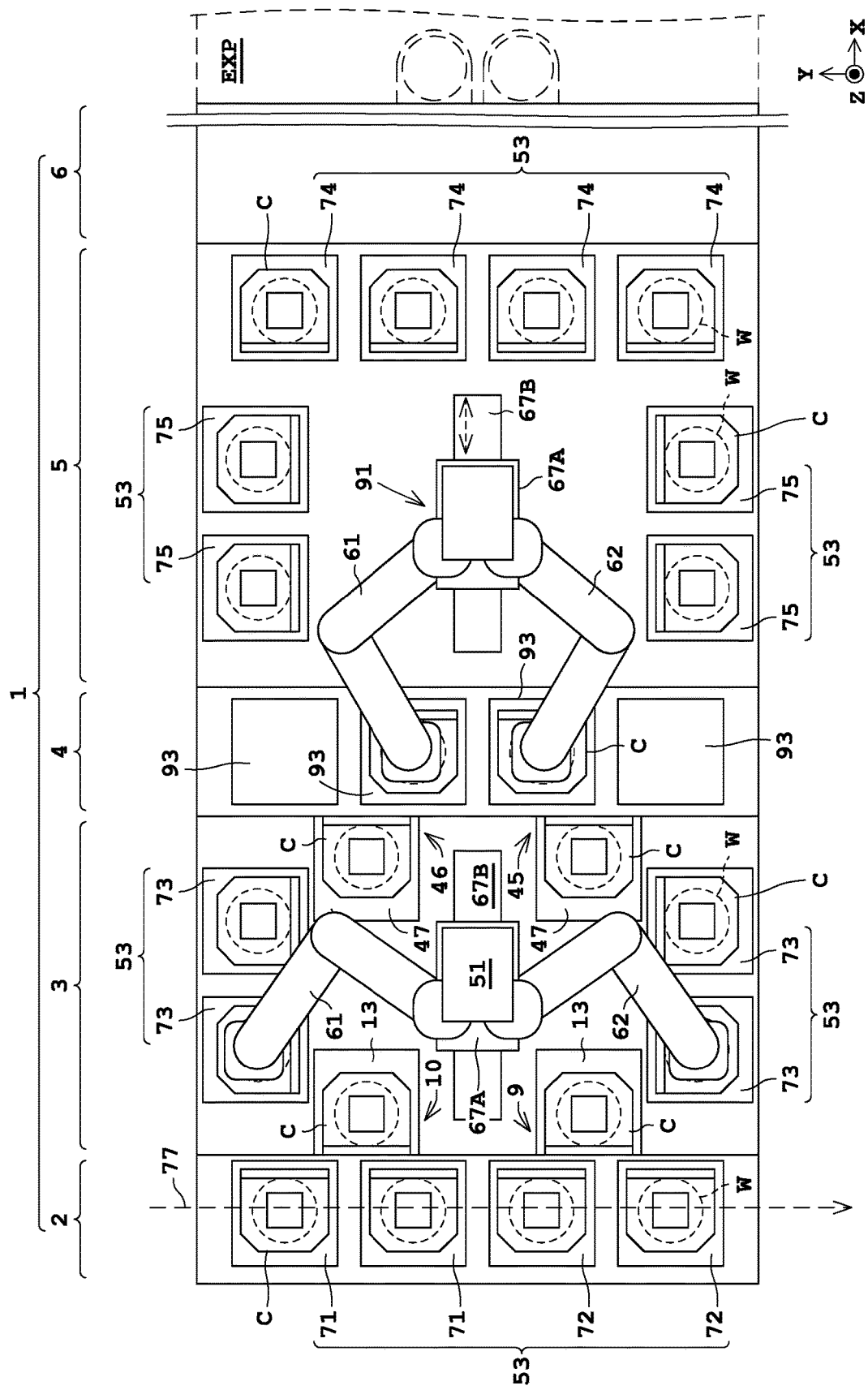
FIG. 28 is a plan view of a carrier buffer device according to one modification of the modification.

(10) In the embodiments and the modifications described above, the carrier buffer device 8 may further include a second carrier transport mechanism 91 for transporting a carrier C, in addition to the carrier transport mechanism 51. For instance, as illustrated in FIG. 28, the second carrier transport mechanism 91 may be mounted opposite to the carrier transport mechanism 51 across the second ID block 4 on the second treating block 5 (at least one treating block on a second end side). Moreover, the second carrier transport mechanism 91 may be mounted on the second treating block 5 and the IF block 6. The two carrier transport mechanisms 51, 91 transport carriers C, and thus, efficiency in transporting carriers can be increased. As a result, a throughput of the substrate treating apparatus 1 can be enhanced.

Moreover, as illustrated in FIG. 28, the carrier buffer device 8 may further include a relay carrier platform 93 disposed on the second ID block 4. The carrier transport mechanism 51 transports a carrier C to the second carrier transport mechanism 91 with the relay carrier platform 93. That is, the carrier transport mechanism 51 transports a carrier C to the relay carrier platform 93, and the second carrier transport mechanism 91 receives the carrier C transported to the relay carrier platform 93. In addition, the second carrier transport mechanism 91 transports the carrier C to the carrier transport mechanism 51 with the relay carrier platform 93. Accordingly, an area above the second ID block 4 is usable as a relay carrier platform 93 for the two carrier transport mechanisms 51, 91. This achieves smooth delivery of the carrier C. Here, three or more carrier transport mechanisms can be provided.

(11) In the embodiments and the modifications described above, the carrier transport mechanism 51 is mounted on the first treating block 3 in FIG. 5, for example. In this regard, the carrier transport mechanism 51 may be mounted on the first ID block 2. Moreover, the carrier transport mechanism 51 may be mounted on the first ID block 2 and the first treating block 3.

The carrier storage shelves 53 are mounted on the first ID block 2 and the first treating block 3. In this regard, the carrier storage shelves 53 may be mounted on the first ID block 2 or the first treating block 3.

Figure 29:
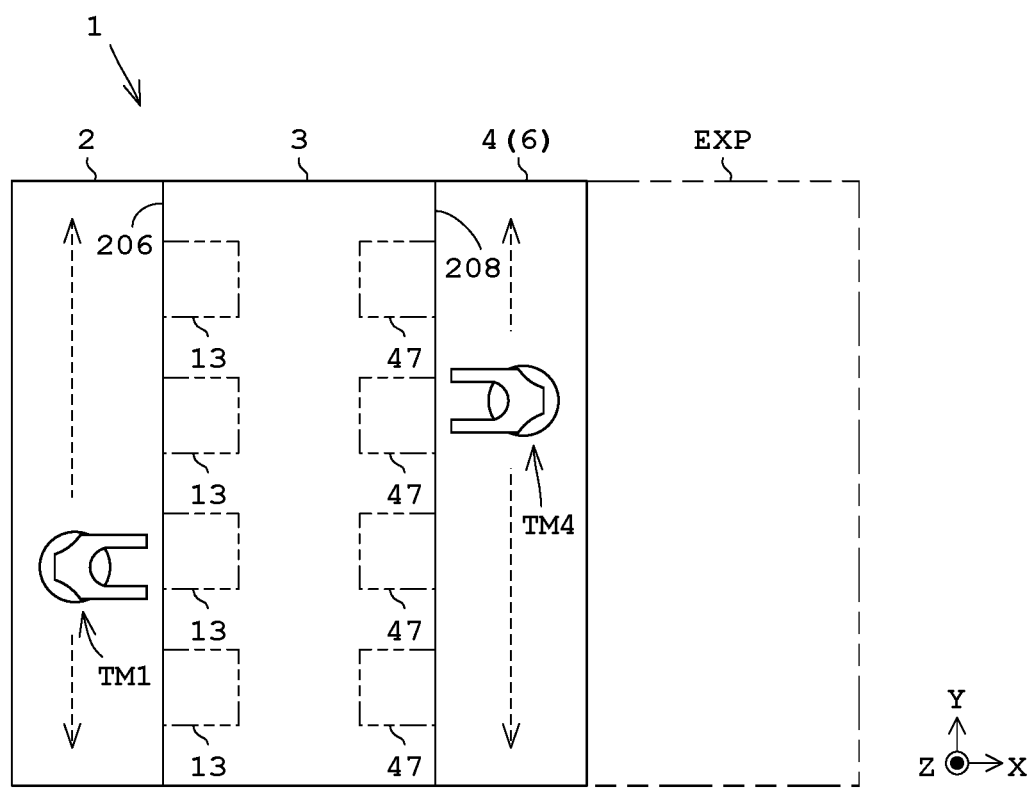
FIG. 29 is a horizontal cross-sectional view illustrating a substrate treating apparatus according to one modification of the present invention.

(12) In the embodiments and modifications described above, the first ID block 2 includes the two substrate transport mechanisms TM1, TM2. Alternatively, the first ID block 2 may include a single substrate transport mechanism TM1 as in FIG. 29. In this case, a plurality of (e.g., four) platforms 13 may be arranged on a wall 206 of the first ID block 2 in line in the Y-direction. The substrate transport mechanism TM1 may be configured in such a manner as to be movable in the Y-direction by an electric motor in order to take and accommodate substrates W from and into the carriers C placed the platforms 13.

Moreover, as in the first embodiment, the single substrate transport mechanism TM1 may be fixed on a floor of the first ID block 2 so as not to move horizontally (especially, Y-direction). Moreover, the first ID block 2 may include three or more substrate transport mechanisms.

(13) In the embodiments and the modifications described above, the second ID block 4 (or the IF block 6) includes the two substrate transport mechanisms TM4, TM5, for example. Alternatively, the second ID block 4 may include a single substrate transport mechanism TM4 as in FIG. 29, for example. Also in this case, a plurality of (e.g., four) platforms 47 may be arranged on a wall 208 of the second ID block 4 in line in the Y-direction. The substrate transport mechanism TM4 may be configured in such a manner as to be movable in the Y-direction by an electric motor in order to take and accommodate substrates W from and into the carriers C placed the platforms 47.

Moreover, as in the first embodiment, the single substrate transport mechanism TM4 may be fixed on a floor of the second ID block 4 so as not to move horizontally (especially, Y-direction). Moreover, the second ID block 4 may include three or more substrate transport mechanisms.

(14) In the embodiments and the modifications described above, the carrier C is placed on the carrier storage shelf 53 in such a manner as a face 210 thereof adjacent to the lid is directed inwardly, i.e., faces the carrier transport mechanism 51 as illustrated in FIG. 5. However, the direction where the carrier C placed on the carrier storage shelf 53 is directed is not particularly limited. For instance, it is assumed in FIG. 21 that an IC tag (RFID: radio frequency identification) 212 to store information on each of the carriers C is attached to a face of the carrier C opposite of the face 210 adjacent to the lid. In this case, the carrier C may be disposed in such a manner that the IC tag 212 is directed inwardly, i.e., faces the carrier transport mechanism 51. Moreover, a reader writer 214 as a transmitter may be disposed individually on the grippers 63, 64 of the carrier transport mechanism 51 for reading out the information in the IC tag 212.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate, comprising:
    a first indexer block on which at least one first carrier platform for placing a carrier configured to accommodate a plurality of substrates thereon is disposed;
    a first treating block connected to the first indexer block horizontally;
    a plurality of carrier storage shelves mounted on at least the first treating block of either the first indexer block or the first treating block, and configured to store the carrier; and
    a carrier transport mechanism mounted on the at least the first treating block of either the first indexer block or the first treating block, and configured to transport the carrier between the at least one first carrier platform and the plurality of carrier storage shelves, and
    wherein a guide rail of the carrier transport mechanism is mounted on a top face of the at least the first treating block, and
    the at least one first carrier platform is configured for taking out and returning a substrate with a device located within the first indexer block and is disposed at a higher level than a top face of the first treating block.

2. The substrate treating apparatus according to claim 1, wherein
    the first treating block is formed by a plurality of treating blocks arranged in line,
    the first indexer block is connected horizontally to a treating block of the treating blocks on a first end,
    the plurality of carrier storage shelves is mounted on at least one treating block of either the first indexer block or the treating blocks, and is configured to store the carrier,
    the carrier transport mechanism is mounted on the at least the one treating block of either the first indexer block or the treating blocks, and is configured to transport the carrier between the at least one first carrier platform and the plurality of carrier storage shelves, and
    the guide rail of the carrier transport mechanism is mounted on the top face of the at least one treating block.

3. The substrate treating apparatus according to claim 2, further comprising:
    a second indexer block connected horizontally to a treating block of the treating blocks on a second end, and on which at least one second carrier platform for placing the carrier therein is disposed, wherein
    the plurality of carrier storage shelves is mounted on at least one of the first indexer block, the treating blocks, and the second indexer block, and is configured to store the carrier, and
    the carrier transport mechanism is mounted on at least one of the first indexer block, the treating blocks, and the second indexer block, and is configured to transport the carrier among the at least one first carrier platform, the plurality of carrier storage shelves, and the at least one second carrier platform.

4. The substrate treating apparatus according to claim 2, further comprising:
    a second indexer block disposed between a treating block on a first end side and a treating block on a second end side of the treating blocks, and on which at least one second carrier platform for placing the carrier therein is disposed, wherein
    the plurality of carrier storage shelves is mounted on at least one of the first indexer block, the treating blocks, and the second indexer block, and is configured to store the carrier, and
    the carrier transport mechanism is mounted on at least one of the first indexer block, the treating blocks, and the second indexer block, and is configured to transport the carrier among the at least one first carrier platform, the plurality of carrier storage shelves, and the at least one second carrier platform.

5. The substrate treating apparatus according to claim 4, further comprising:
    a second carrier transport mechanism mounted on the treating block on the second end side, opposite to a first carrier transport mechanism as the carrier transport mechanism, across the second indexer block and configured to transport the carrier.

6. The substrate treating apparatus according to claim 5, further comprising;
    a relay carrier platform disposed on the second indexer block, wherein
    the first carrier transport mechanism transports the carrier to the second carrier transport mechanism with the relay carrier platform, and
    the second carrier transport mechanism transports the carrier to the first carrier transport mechanism with the relay carrier platform.

7. The substrate treating apparatus according to claim 4, wherein
    the carrier transport mechanism includes a gripper configured to grip a carrier, an arm to which the gripper is attached, a drive unit configured to support the arm, and a guide rail mounted on at least two of the treating blocks and the second indexer block,
    the drive unit is configured to allow the gripper and the arm to be movable along the guide rail, and
    the guide rail is mounted on a groove formed in the second indexer block.

8. The substrate treating apparatus according to claim 4, wherein
    the at least one second carrier platform is disposed higher in level than a top face of the plurality of the treating blocks.

9. The substrate treating apparatus according to claim 8, wherein
    the second indexer block includes a substrate transport mechanism configured to transport a substrate,
    the at least one second carrier platform is a plurality of second carrier platforms, and
    the plurality of the second carrier platform is disposed around the substrate transport mechanism in plan view.

10. The substrate treating apparatus according to claim 2, wherein
    the carrier transport mechanism includes a gripper configured to grip the carrier, an arm to which the gripper is attached, a drive unit configured to support the arm, and the guide rail mounted on at least two of the treating blocks, and the drive unit includes an electric motor and is configured to allow the gripper and the arm to be movable along the guide rail with the electric motor.

11. The substrate treating apparatus according to claim 1, wherein
the at least one first carrier platform is disposed above the first treating block.

12. The substrate treating apparatus according to claim 1, wherein
the at least one first carrier platform is disposed in such a manner so as to be housed in an area of at least either the first indexer block or the first treating block in plan view.

13. The substrate treating apparatus according to claim 1, further comprising:
a second indexer block connected opposite to the first indexer block with respect to the first treating block, and on which at least one second carrier platform for placing the carrier therein is disposed, wherein
the plurality of carrier storage shelves is mounted on at least one of the first indexer block, the first treating block, and the second indexer block, and is configured to store the carrier, and
the carrier transport mechanism is mounted on at least one of the first indexer block, the first treating block, and the second indexer block, and is configured to transport the carrier among the at least one first carrier platform, the plurality of carrier storage shelves, and the at least one second carrier platform.

14. The substrate treating apparatus according to claim 1, further comprising:
an opening through which the substrate passes from the carrier placed on the first carrier platform;
a shutter member configured to open and close the opening; and
a shutter member drive mechanism configured to move the shutter member horizontally along the opening.

15. The substrate treating apparatus according to claim 1, further comprising:
a lifting/lowering mechanism disposed in the first indexer block, and configured to move the at least one first carrier platform upwardly/downwardly between a top face side and a floor side of the first indexer block.

16. A carrier transporting method with a substrate treating apparatus, the substrate treating apparatus including:
a first indexer block on which at least one first carrier platform for placing a carrier configured to accommodate substrates thereon is disposed; and
a first treating block connected to the first indexer block horizontally, and the method comprising:
a storing step of storing the carrier in each of a plurality of carrier storage shelves mounted on the at least the first treating block of either the first indexer block or the first treating block; and
a transporting step of transporting the carrier between the at least one first carrier platform and the plurality of carrier storage shelves with a carrier transport mechanism mounted on the at least the first treating block of either the first indexer block or the first treating block, and
wherein a guide rail of the carrier transport mechanism is mounted on a top face of the at least the first treating block, and
the at least one first carrier platform is configured for taking out and returning a substrate with a device located within the first indexer block and is disposed at a higher level than a top face of the first treating block.

17. A carrier buffer device disposed in a substrate treating apparatus body including a first indexer block on which at least one first carrier platform for placing a carrier configured to accommodate substrates thereon is disposed, and a first treating block connected to the first indexer block horizontally, the carrier buffer device comprising:
a plurality of carrier storage shelves mounted on the at least the first treating block of either the first indexer block or the first treating block, and configured to store the carrier; and
a carrier transport mechanism mounted on the at least the first treating block of either the first indexer block or the first treating block, and configured to transport the carrier between the at least one first carrier platform and the plurality of carrier storage shelves, and
wherein a guide rail of the carrier transport mechanism is mounted on a top face of the at least first treating block, and
the at least one first carrier platform is configured for taking out and returning a substrate with a device located within the first indexer block and is disposed at a higher level than a top face of the first treating block.

* * * * *